(12) United States Patent
Sasaki et al.

(10) Patent No.: US 8,890,150 B2
(45) Date of Patent: Nov. 18, 2014

(54) SEMICONDUCTOR DEVICE

(75) Inventors: Toshinari Sasaki, Tochigi (JP); Kosei Noda, Atsugi (JP); Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 211 days.

(21) Appl. No.: 13/353,608

(22) Filed: Jan. 19, 2012

(65) Prior Publication Data

US 2012/0193628 A1    Aug. 2, 2012

(30) Foreign Application Priority Data

Jan. 27, 2011 (JP) ................. 2011-014652

(51) Int. Cl.
*H01L 29/04* (2006.01)
*H01L 29/10* (2006.01)
*H01L 31/00* (2006.01)
*H01L 29/786* (2006.01)

(52) U.S. Cl.
CPC ................. *H01L 29/7869* (2013.01)
USPC ............................ 257/59; 438/197

(58) Field of Classification Search
USPC ............................ 257/59; 438/197
See application file for complete search history.

(56) References Cited

U.S. PATENT DOCUMENTS

| | | |
|---|---|---|
| 5,528,032 A | 6/1996 | Uchiyama |
| 5,614,727 A | 3/1997 | Mauri et al. |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,". Appl. Phys. Lett. (Applied Physics Letters), Sep. 27, 2004, vol. 85, No. 13, pp. 2541-2543.

(Continued)

*Primary Examiner* — Sonya D McCall Shepard
(74) *Attorney, Agent, or Firm* — Eric J. Robinson; Robinson Intellectual Property Law Office, P.C.

(57) ABSTRACT

A highly reliable semiconductor device is manufactured by giving stable electric characteristics to a transistor in which an oxide semiconductor film is used. A p-type oxide semiconductor material is contained in an n-type oxide semiconductor film, whereby carriers which are generated in the oxide semiconductor film without intention can be reduced. This is because electrons generated in the n-type oxide semiconductor film without intention are recombined with holes generated in the p-type oxide semiconductor material to disappear. Accordingly, it is possible to reduce carriers which are generated in the oxide semiconductor film without intention.

30 Claims, 21 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0102313 A1* | 4/2010 | Miyairi et al. .................. 257/43 |
| 2010/0109002 A1 | 5/2010 | Itagaki et al. |
| 2010/0117074 A1 | 5/2010 | Yamazaki et al. |
| 2010/0136743 A1 | 6/2010 | Akimoto et al. |
| 2010/0140609 A1 | 6/2010 | Yano et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2010-123836 | 6/2010 |
| JP | 2010-135773 | 6/2010 |
| JP | 2010-219214 | 9/2010 |
| WO | WO-2004/114391 | 12/2004 |
| WO | WO 2008/117739 | 10/2008 |
| WO | WO 2010/024034 | 3/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004. vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW'08: Proceedings of the 15th International Display Workshops, Dec. 3, 2008, pp. 1637-1640.

Hayashi.R at al., "42.1: Invited Paper: Improved Amorphous In—Ga—Zn—O TFTs,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irridation with Ultraviolet Lamp,", Journal of Sol-Gel Science and Technology, 2003, vol. 26, pp. 181-184.

Osada.T et al., "15.2: Development of Driver-Integrated Panel using Amorphous In—G—Zn—Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)M (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Galium—Zinc Oxides TFTs Array,", SID Digest '08: SID International Sympsium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09: SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTs,", IDW '09: Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD'09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09: SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.

(56) References Cited

OTHER PUBLICATIONS

Lee.H et al., "Current Status of, Challenges to, and Perspective view of AM-OLED,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008 vol. 92, pp. 072104-1-072104-3.

Hsieh.H et al., "P-29:Modeling of Amorphous Oxide Semiconductor Thin Film Transistors and Subgap Density of Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m <4):a Zn4s conductor,", Philosphical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo. Y et al., "Amorphous Oxide TFT Backplanes for Large Size AMOLED Displays,", IDW'08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminium Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2012/051132) dated Feb. 21, 2012.

Written Opinion (Application No. PCT/JP2012/051132) dated Feb. 21, 2012.

\* cited by examiner

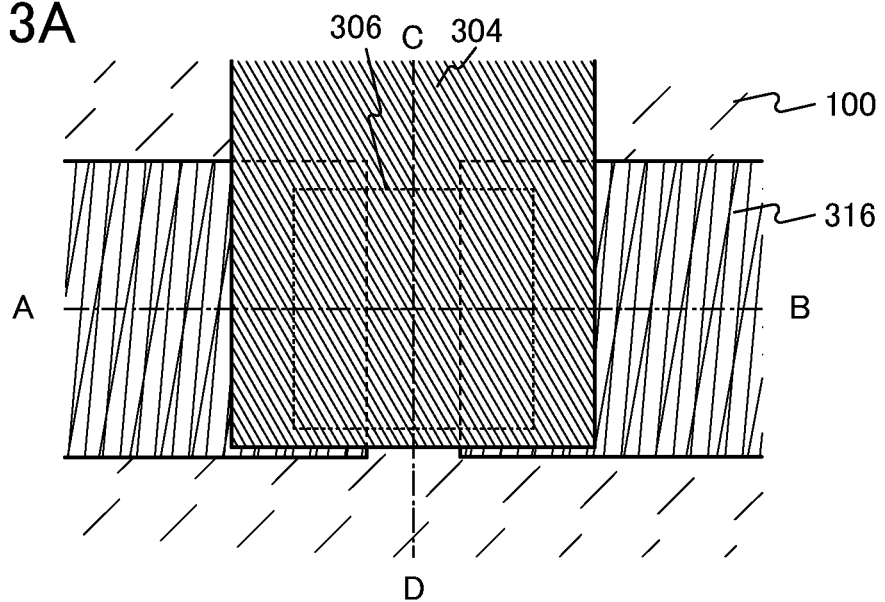
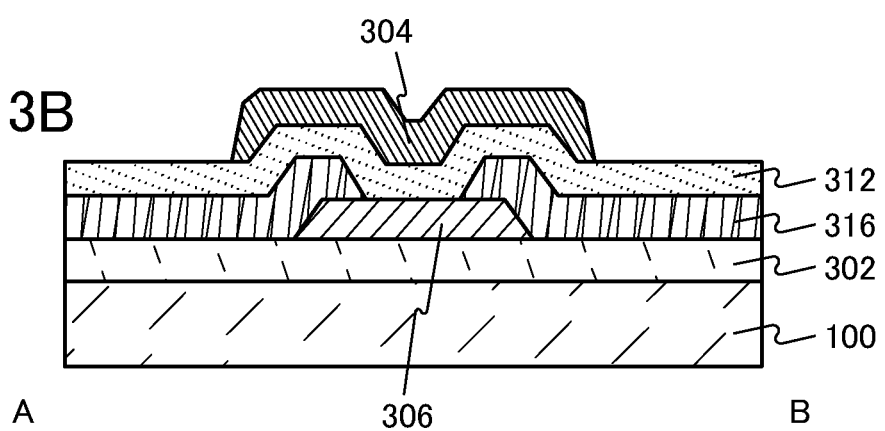
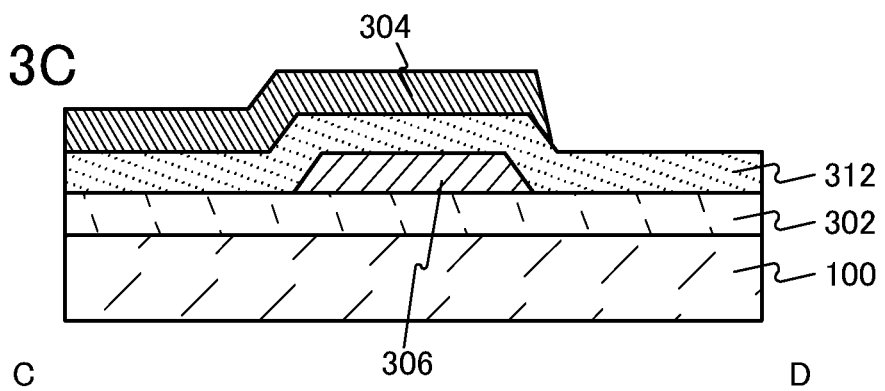

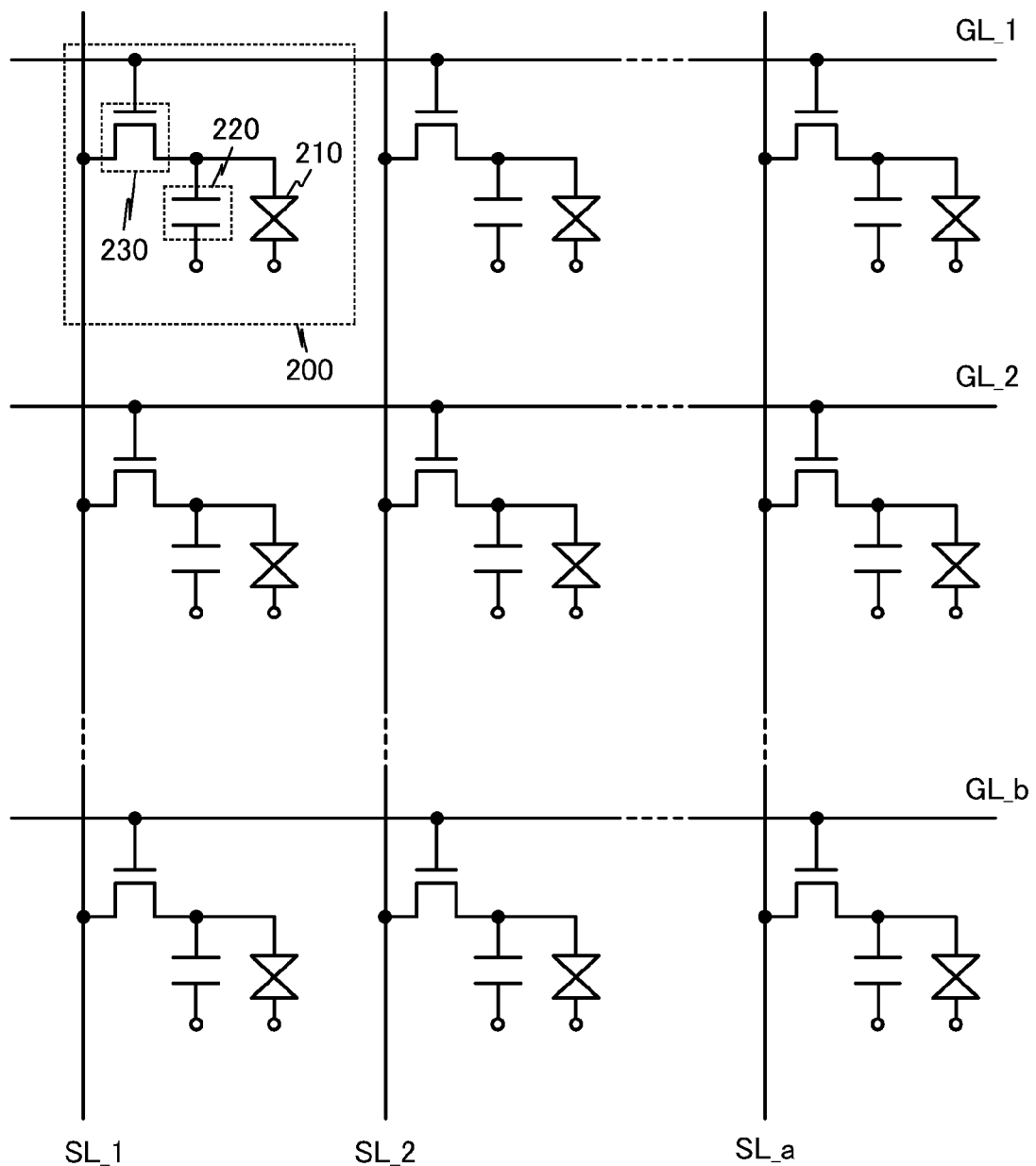

SEMICONDUCTOR DEVICE

TECHNICAL FIELD

The present invention relates to a semiconductor device which is provided with a circuit including a semiconductor element such as a transistor. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component. Moreover, the present invention relates to an oxide used in the semiconductor device.

In this specification, a semiconductor device generally refers to a device which can function by utilizing semiconductor characteristics; an electro-optical device, a light-emitting display device, a semiconductor circuit, and an electronic device are all included in the category of the semiconductor device.

BACKGROUND ART

Many transistors formed over a glass substrate or the like are manufactured using amorphous silicon, polycrystalline silicon, or the like, as typically seen in liquid crystal display devices. Although transistors manufactured using amorphous silicon have low field-effect mobility, they can be formed over a larger glass substrate. On the other hand, although transistors manufactured using polycrystalline silicon have high field-effect mobility, they are not suitable for being formed over a larger glass substrate.

Other than the transistors manufactured using silicon, in recent years, a technology in which a transistor is manufactured using an oxide semiconductor and applied to an electronic device or an optical device has attracted attention. For example, a technology in which a transistor is manufactured using zinc oxide or an In—Ga—Zn—O-based oxide as an oxide semiconductor and used for a switching element of a pixel of a display device or the like is disclosed in Patent Document 1 and Patent Document 2.

REFERENCE

Patent Document

[Patent Document 1] Japanese Published Patent Application No. 2007-123861
[Patent Document 2] Japanese Published Patent Application No. 2007-096055

DISCLOSURE OF INVENTION

It is an object to manufacture a highly reliable semiconductor device by giving stable electric characteristics to a transistor in which an oxide semiconductor film is used for a channel region.

It is a technical idea of an embodiment of the present invention to use an n-type oxide semiconductor film containing a p-type oxide semiconductor material for a channel region of a transistor.

In general, part of oxygen deficiency in an oxide semiconductor film serves as a donor and causes release of an electron which is a carrier. Thus, the use of an oxide semiconductor film for a channel region of a transistor might cause a shift of the threshold voltage of the transistor in the negative direction owing to oxygen deficiency. In order to prevent the shift of the threshold voltage of a transistor in the negative direction, it is necessary to form an oxide semiconductor film in which oxygen deficiency is not caused. However, it is difficult to suppress also release of a minute amount of oxygen in heat treatment which is performed after an oxide semiconductor film is formed or in exposure of an uncovered oxide semiconductor film to a reduced-pressure atmosphere. Even a minute amount of oxygen deficiency in an oxide semiconductor film causes the shift of the threshold voltage of a transistor in the negative direction; thus, even the release of a minute amount of oxygen described above could cause a malfunction of a semiconductor device.

Therefore, it is expected to reduce carriers which are generated in an oxide semiconductor film without intention. Specifically, a p-type oxide semiconductor material is contained in an n-type oxide semiconductor film, whereby carriers which are generated in the oxide semiconductor film without intention can be reduced. This is because electrons generated in the n-type oxide semiconductor film without intention are recombined with holes generated in the p-type oxide semiconductor material to disappear. Accordingly, it is possible to reduce carriers which are generated in the oxide semiconductor film without intention. That is, in accordance with an embodiment of the present invention, the shift of the threshold voltage of a transistor in the negative direction can be suppressed. In addition, it is possible to control the threshold voltage of the transistor by adjusting the amount of a p-type oxide semiconductor material contained in an n-type oxide semiconductor film. Further, in the case where the bond energy between oxygen and another element in a p-type oxide semiconductor material is higher than the bond energy between oxygen and another element in an n-type oxide semiconductor material, when the p-type oxide semiconductor material is contained in the n-type oxide semiconductor film, release of oxygen contained in the n-type oxide semiconductor film can be suppressed.

For example, when an n-type oxide semiconductor film is formed, a p-type oxide semiconductor material is mixed, whereby the p-type oxide semiconductor material can be contained in the n-type oxide semiconductor film. Specifically, the following method may be employed: an n-type oxide semiconductor material and a p-type oxide semiconductor material are mixed and baked to form a sputtering target, and an n-type oxide semiconductor film containing the p-type oxide semiconductor material is formed using the sputtering target. Alternatively, the following method may be employed: an appropriate amount of a sintered body of a p-type oxide semiconductor material is put on a surface of an n-type oxide semiconductor material target, and an n-type oxide semiconductor film containing the p-type oxide semiconductor material is formed by a co-sputtering method. At this time, the sintered body of the p-type oxide semiconductor material is preferably put on a region of the n-type oxide semiconductor sputtering target where an electric field is converged (a region where erosion is caused), in which case the p-type oxide semiconductor material can be efficiently contained in the n-type oxide semiconductor film. Further alternatively, a multi-sputtering method using an n-type oxide semiconductor material target and a p-type oxide semiconductor material target may be performed.

Furthermore, an insulating material such as silicon oxide or germanium oxide may be contained in the n-type oxide semiconductor film, in addition to the p-type oxide semiconductor material. The insulating material may be mixed into an n-type oxide semiconductor material or a p-type oxide semiconductor material in advance, or may be contained by a method similar to that in the case where the p-type oxide semiconductor material is contained in the n-type oxide semiconductor film. In the case where the bond energy between oxygen and another element in the insulating material is higher than the bond energy between oxygen and another element in the n-type oxide semiconductor material, when the insulating material is contained in the n-type oxide semiconductor film, release of oxygen from the n-type oxide semiconductor film can be suppressed.

In accordance with an embodiment of the present invention, it is possible to provide a material suitable for a semiconductor included in a transistor, a diode, or the like.

Further, it is possible to manufacture a highly reliable semiconductor device by giving stable electric characteristics to a transistor in which an oxide semiconductor film is used for a channel region.

BRIEF DESCRIPTION OF DRAWINGS

FIGS. 3A to 3C are a top view and cross-sectional views illustrating an example of a transistor according to an embodiment of the present invention.

FIG. 7 is a circuit diagram showing an example of a liquid crystal display device including a transistor according to an embodiment of the present invention.

BEST MODE FOR CARRYING OUT THE INVENTION

Figure 1A:
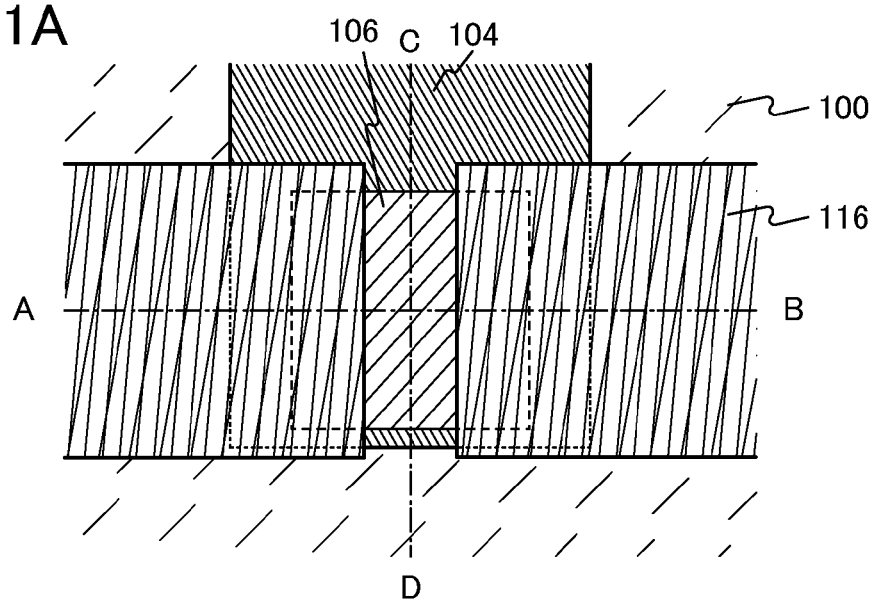
FIGS. 1A to 1C are a top view and cross-sectional views illustrating an example of a transistor according to an embodiment of the present invention.

Hereinafter, embodiments and an example of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to the description of the embodiments and the example below. In describing structures of the invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively called a drain.

In addition, voltage refers to a potential difference between a predetermined potential and a reference potential (e.g., a ground potential or a source potential) in many cases. Accordingly, a voltage can also be referred to as a potential.

Further, even when it is written in this specification that "to be connected", there is a case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the invention.

Embodiment 1

In this embodiment, an example of a transistor according to an embodiment of the present invention will be described with reference to FIGS. 1A to 1C.

FIG. 1A is a top view of the transistor. A cross section along dashed-dotted line A-B in FIG. 1A and a cross section along dashed-dotted line C-D in FIG. 1A correspond to a cross section A-B in FIG. 1B and a cross section C-D in FIG. 1C, respectively.

Here, the cross section A-B in FIG. 1B will be described in detail.

Figure 1B:
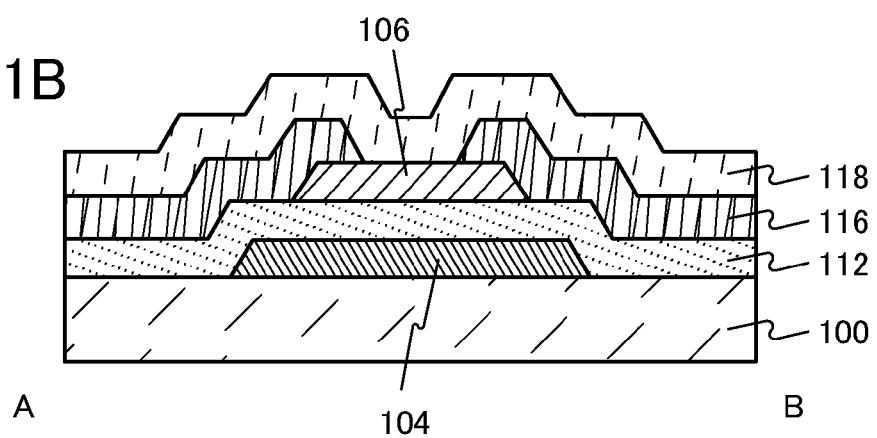
Figure 1C:
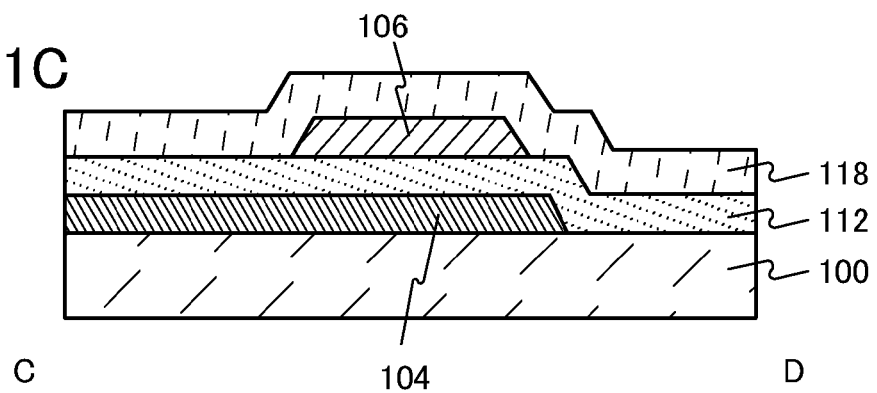

The transistor illustrated in FIG. 1B includes a gate electrode 104 over a substrate 100, a gate insulating film 112 covering the gate electrode 104, an oxide semiconductor film 106 over the gate electrode 104 with the gate insulating film 112 interposed therebetween, a pair of electrodes 116 which are over the oxide semiconductor film 106 and partly in contact with the oxide semiconductor film 106, and an interlayer insulating film 118 covering the gate insulating film 112, the oxide semiconductor film 106, and the pair of electrodes 116.

There is no particular limitation on the substrate 100 as long as it has heat resistance enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like can be used. Still alternatively, any of these substrates further provided with a semiconductor element may be used as the substrate 100.

A flexible substrate may alternatively be used as the substrate 100. In that case, a transistor is formed directly over the flexible substrate. Note that as a method for forming a transistor over a flexible substrate, there is also a method in which, after a non-flexible substrate is used as the substrate 100 and a transistor is formed thereover, the transistor is separated from the substrate and transferred to a flexible substrate. In that case, a separation layer is preferably provided between the substrate 100 and the transistor.

The gate electrode 104 may be formed to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements. The oxide may contain nitrogen at higher than or equal to $5 \times 10^{19}$ cm$^{-3}$ and lower than or equal to 20 at. %, preferably higher than or equal to $1 \times 10^{20}$ cm$^{-3}$ and lower than or equal to 7 at. %. For example, an oxide film which contains nitrogen at higher than or equal to $1 \times 10^{20}$ cm$^{-3}$ and lower than or equal to 7 at. % and also contains In, Ga, and Zn is used. Since an oxide film has higher resistance than a metal film, in the case of using an oxide film for the gate electrode 104, it is preferable to use a stacked-layer structure of the oxide film and a low-resistance film having a sheet resistance of lower than or equal to 10 Ω/sq in order to reduce the resistance of the gate electrode 104. In this case, the gate electrode 104 is formed such that the oxide film is located on the gate insulating film 112 side.

The oxide semiconductor film 106 is an n-type oxide semiconductor film containing a p-type oxide semiconductor material or an n-type oxide semiconductor film containing an insulating material such as silicon oxide or germanium oxide as well as a p-type oxide semiconductor material. By adjusting the mixture ratio of the above materials, the threshold voltage of the transistor can be controlled.

For example, two or more kinds of elements selected from In, Ga, Zn, and Sn may be used as the materials of the n-type oxide semiconductor film.

For example, for the n-type oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, an In—Ga—Zn—O-based material means an oxide containing indium (In), gallium (Ga), and zinc (Zn), and there is no particular limitation on the atomic ratio. Further, the In—Ga—Zn—O-based material may contain an element other than In, Ga, and Zn. Note that the amount of oxygen is preferably in excess of that in stoichiometric proportion of the oxide semiconductor film. When the amount of oxygen is in excess of that in stoichiometric proportion, generation of carriers which results from oxygen deficiency in the oxide semiconductor film can be suppressed.

For example, in the case where an In—Zn—O-based material is used for the oxide semiconductor film, the atomic ratio is set so that In/Zn is in a range of from 0.5 to 50, preferably from 1 to 20, more preferably from 3 to 15. When the atomic ratio of In to Zn is in the above range, the field-effect mobility of the transistor can be improved. Here, when the atomic ratio of the compound is In:Zn:O=X:Y:Z, the relation Z>1.5X+Y is satisfied.

Further, a material represented by InMO$_3$(ZnO)$_m$ (m>0) may be used for the n-type oxide semiconductor film. Here, M represents one or more metal elements selected from Ga, Al, Mn, and Co. For example, M may be Ga, Ga and Al, Ga and Mn, Ga and Co, or the like.

As the p-type oxide semiconductor material, for example, a material containing any of Ni, La, Sr, Nd, Na, and Cu may be used. Specifically, a Ni—O-based material, a Cu—O-based material, a La—Ni—O-based material, an Nd—Ni—O-based material, a Sr—Cu—O-based material, a La—Cu—O-based material, or the like may be used. Note that the p-type oxide semiconductor material is not limited to the above material, and any material can be used as long as the material has a p-type semiconductor property. Instead of the p-type oxide semiconductor material, a p-type non-oxide semiconductor material may be used. When the p-type oxide semiconductor material containing a metal having bond energy with oxygen which is higher than bond energy with In and Zn is contained in the n-type oxide semiconductor film, release of oxygen from the n-type oxide semiconductor film can be suppressed.

At this time, when the proportion of the p-type oxide semiconductor is too low, the threshold voltage can hardly change. In addition, when the proportion of the p-type oxide semiconductor is too high, the amount of electrons which are main carriers is reduced; thus, there is a possibility that the transistor characteristics cannot be obtained. Therefore, the proportion of the p-type oxide semiconductor needs to be in an appropriate range.

Note that the bond energy between oxygen and silicon in silicon oxide and the bond energy between oxygen and germanium in germanium oxide are high. Therefore, when an insulating material such as silicon oxide or germanium oxide is contained in the n-type oxide semiconductor film, release of oxygen from the n-type oxide semiconductor film can be suppressed. In the case where the n-type oxide semiconductor film includes a material which is easily crystallized, mixing an insulating material in the n-type oxide semiconductor film can suppress crystallization of the n-type oxide semiconductor film. However, when the proportion of an insulating material contained is too low, the above effect becomes poor. In addition, when the proportion of an insulating material contained is too high, the field-effect mobility of the transistor might be reduced. Therefore, the proportion of the insulating material mixed needs to be in an appropriate range.

Provided that the mixture ratio (atomic ratio) of an n-type oxide semiconductor, a p-type oxide semiconductor, and an insulator is X:Y:Z, Y/(X+Y) is greater than or equal to 0.0001 and less than or equal to 0.15, and Z/(X+Y+Z) is greater than or equal to 0.01 and less than or equal to 0.3. Preferably, Y/(X+Y) is greater than or equal to 0.01 and less than or equal to 0.05, and Z/(X+Y+Z) is greater than or equal to 0.01 and less than or equal to 0.2. Note that Z may also be 0.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure in which crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range of from 85° to 95°. In addition, a simple term "parallel" includes a range of from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in the transistor, change in electric characteristics of the transistor due to irradiation with visible light or ultraviolet light can be reduced. Thus, the transistor has high reliability.

The gate insulating film 112 and the interlayer insulating film 118 may each be formed to have a stacked-layer structure or a single-layer structure using, for example, one or more of silicon oxide, silicon oxynitride, silicon nitride oxide, silicon nitride, aluminum oxide, hafnium oxide, yttrium oxide, zirconium oxide, and the like. For example, the gate insulating film 112 and the interlayer insulating film 118 may be formed by a thermal oxidation method, a CVD method (such as a plasma CVD method or a thermal CVD method), a sputtering method, or the like. Note that for example, in the case where a silicon oxide film is formed by a thermal oxidation method, a silicon film may be formed and subjected to thermal oxidation treatment. The silicon film may be formed using amorphous silicon or crystalline silicon. As each of the gate insulating film 112 and the interlayer insulating film 118, a film from which oxygen is released by heat treatment may be used. With the use of such a film from which oxygen is released by heat treatment, defects generated in the oxide semiconductor film 106 can be repaired and deterioration in electric characteristics of the transistor can be suppressed.

In this specification, silicon oxynitride refers to a substance that contains more oxygen than nitrogen and for example, silicon oxynitride contains oxygen, nitrogen, silicon, and hydrogen at concentrations ranging from higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide refers to a substance that contains more nitrogen than oxygen and for example, silicon nitride oxide contains oxygen, nitrogen, silicon, and hydrogen at concentrations ranging from higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that the above ranges are ranges for cases where measurement is performed using Rutherford backscattering spectrometry (RBS) and hydrogen forward scattering spectrometry (HFS). In addition, the total of the percentages of the constituent elements does not exceed 100 at. %.

In the case where a material of the gate electrode 104 and/or the pair of electrodes 116 diffuses into the oxide semiconductor film 106 to adversely affect the transistor characteristics, an insulating film in which the diffusion coefficient of the material of the gate electrode 104 and/or the pair of electrodes 116 is low may be used as each of the gate insulating film 112 and the interlayer insulating film 118. The interlayer insulating film 118 serves as a protective film of the oxide semiconductor film 106.

To release oxygen by heat treatment means that the released amount of oxygen which is converted into oxygen atoms is greater than or equal to $1.0 \times 10^{18}$ atoms/cm$^3$, preferably greater than or equal to $3.0 \times 10^{20}$ atoms/cm$^3$ in a thermal desorption spectroscopy (TDS) analysis.

Here, a method in which the amount of released oxygen is measured by conversion into oxygen atoms using a TDS analysis will be described below.

The amount of released gas in a TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the amount of the released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. $CH_3OH$, which is given as a gas where M/z=32, is not taken into consideration on the assumption that it is unlikely to be present. Further, an oxygen molecule including an oxygen atom where M/z=17 or 18 which is an isotope of an oxygen atom is not taken into consideration either because the proportion of such a molecule in the natural world is minimal $$N_{O2}=N_{H2}/S_{H2} \times S_{O2} \times \alpha \text{(Equation 1)}$$

$N_{H2}$ is the value obtained by conversion of the amount of hydrogen molecules desorbed from the standard sample into densities. $S_{H2}$ is the integral value of a spectrum when the standard sample is subjected to the TDS analysis. Here, the reference value of the standard sample is set to $N_{H2}/S_{H2}$. $S_{O2}$ is the integral value of a spectrum when the insulating film is subjected to the TDS analysis. $\alpha$ is a coefficient affecting the intensity of the spectrum in the TDS analysis. Refer to Japanese Published Patent Application No. H6-275697 for details of Equation 1. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen converted into oxygen atoms is twice the amount of the released oxygen molecules.

In the above structure, the film from which oxygen is released by heat treatment may be oxygen-excess silicon oxide ($SiO_X(X>2)$). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the gate insulating film 112 or the interlayer insulating film 118 to the oxide semiconductor film 106, the interface state density between the oxide semiconductor film 106 and the gate insulating film 112 or the interface state density between the oxide semiconductor film 106 and the interlayer insulating film 118 can be decreased. As a result, carrier trapping due to an operation of the transistor or the like at the interface between the oxide semiconductor film 106 and the gate insulating film 112 or the interface between the oxide semiconductor film 106 and the interlayer insulating film 118 can be suppressed, and thus, a transistor with less deterioration in electric characteristics can be obtained.

Further, electric charge is generated owing to oxygen deficiency in the oxide semiconductor film in some cases. In general, part of oxygen deficiency in an oxide semiconductor film serves as a donor and causes release of an electron which is a carrier. As a result, the threshold voltage of a transistor shifts in the negative direction. When oxygen is sufficiently supplied from the gate insulating film 112 or the interlayer insulating film 118 to the oxide semiconductor film 106, oxygen deficiency in the oxide semiconductor film which causes the shift of the threshold voltage of the transistor in the negative direction can be reduced.

In other words, by providing a film from which oxygen is released by heat treatment for the gate insulating film 112 or the interlayer insulating film 118, the interface state density at an interface between the oxide semiconductor film 106 and the gate insulating film 112 or the interface state density at an interface between the oxide semiconductor film 106 and the interlayer insulating film 118, and the oxygen deficiency in the oxide semiconductor film 106 can be reduced. Thus, the influence of carrier trapping at the interface between the oxide semiconductor film 106 and the gate insulating film 112 or at the interface between the oxide semiconductor film 106 and the interlayer insulating film 118 can be reduced.

The pair of electrodes 116 may be formed with a single-layer structure or a stacked-layer structure using a metal film, a metal nitride film, a metal oxide film, an alloy film, or the like given for the gate electrode 104.

When a film containing Cu is used for the pair of electrodes 116, the resistance of a wiring can be reduced, and generation of wiring delays or the like even in a large-sized display device can be reduced. In the case of using Cu for the pair of electrodes 116, an adhesion property to the substrate 100 becomes poor depending on the material of the substrate 100; thus, it is preferable for the pair of electrodes 116 to have a stacked-layer structure including a film having a favorable adhesion property to the substrate 100. As the film having a favorable adhesion property to the substrate 100, a metal film or an alloy film containing one or more of Ti, Mo, Mn, Cu, Al, and the like may be used. For example, a Cu—Mn—Al alloy may be used.

As described above, by using an n-type oxide semiconductor film containing a p-type oxide semiconductor material for a channel region, stable electric characteristics can be given to a transistor and thus a highly reliable semiconductor device can be manufactured.

This embodiment can be implemented in appropriate combination with the other embodiments.

Embodiment 2

In this embodiment, a transistor having a structure different from that of the transistor described in Embodiment 1 will be described.

Figure 2A:
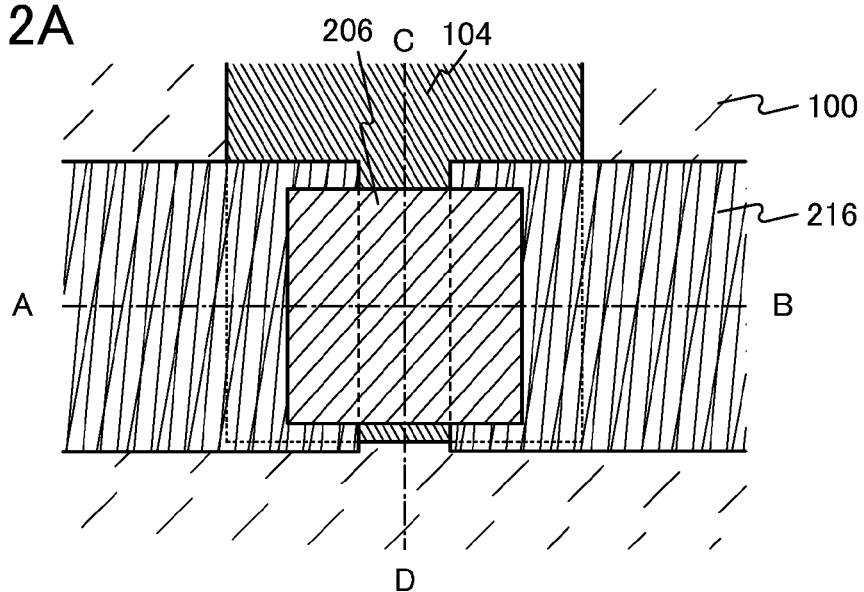
FIGS. 2A to 2C are a top view and cross-sectional views illustrating an example of a transistor according to an embodiment of the present invention.
Figure 2B:
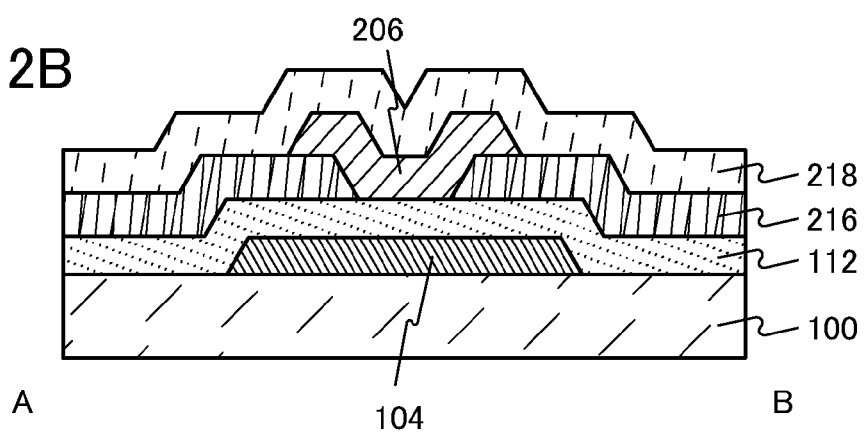
Figure 2C:
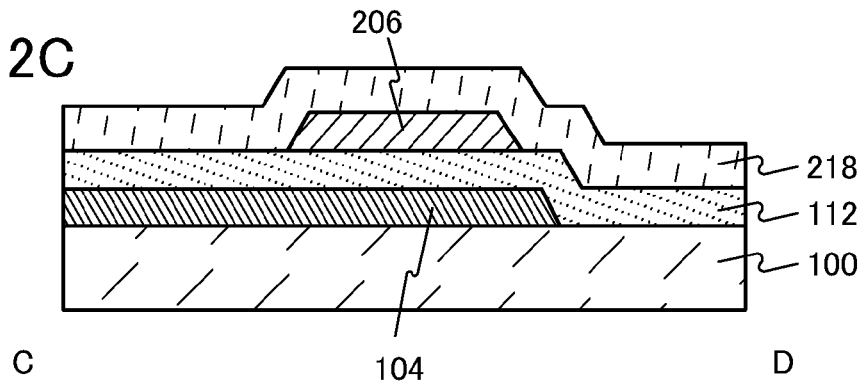

FIGS. 2A to 2C are a top view and cross-sectional views of a transistor according to an embodiment of the present invention. A cross section along dashed-dotted line A-B in FIG. 2A and a cross section along dashed-dotted line C-D in FIG. 2A correspond to a cross section A-B in FIG. 2B and a cross section C-D in FIG. 2C, respectively.

The cross section A-B in FIG. 2B will be described in detail below.

The transistor illustrated in FIG. 2B includes a gate electrode 104 over a substrate 100, a gate insulating film 112 covering the gate electrode 104, a pair of electrodes 216 over the gate insulating film 112, an oxide semiconductor film 206 which is over the pair of electrodes 216 and partly in contact with the pair of electrodes 216, and an interlayer insulating film 218 covering the gate insulating film 112, the pair of electrodes 216, and the oxide semiconductor film 206. The pair of electrodes 216, the oxide semiconductor film 206, and the interlayer insulating film 218 may be formed using materials and methods similar to those of the pair of electrodes 116, the oxide semiconductor film 106, and the interlayer insulating film 118 described in Embodiment 1, respectively.

In addition, with the use of the oxide semiconductor film 106 described in Embodiment 1 as the oxide semiconductor film 206, a transistor in which the interface state density at an interface between the oxide semiconductor film and the gate insulating film in contact with the oxide semiconductor film is low can be obtained.

FIGS. 3A to 3C are a top view and cross-sectional views of a transistor according to an embodiment of the present invention. A cross section along dashed-dotted line A-B in FIG. 3A and a cross section along dashed-dotted line C-D in FIG. 3A correspond to a cross section A-B in FIG. 3B and a cross section C-D in FIG. 3C, respectively.

The cross section A-B in FIG. 3B will be described in detail below.

The transistor illustrated in FIG. 3B includes an oxide semiconductor film 306 over a base insulating film 302 provided over a substrate 100, a pair of electrodes 316 which are over the oxide semiconductor film 306 and partly in contact with the oxide semiconductor film 306, a gate insulating film 312 covering the oxide semiconductor film 306 and the pair of electrodes 316, and a gate electrode 304 provided over the oxide semiconductor film 306 with the gate insulating film 312 interposed therebetween. Here, the pair of electrodes 316, the oxide semiconductor film 306, the gate electrode 304, and the gate insulating film 312 may be formed using materials and methods similar to those of the pair of electrodes 116, the oxide semiconductor film 106, the gate electrode 104, and the gate insulating film 112 described in Embodiment 1, respectively.

The base insulating film 302 can be formed using a material and a method similar to those of the gate insulating film 312.

Figure 4A:
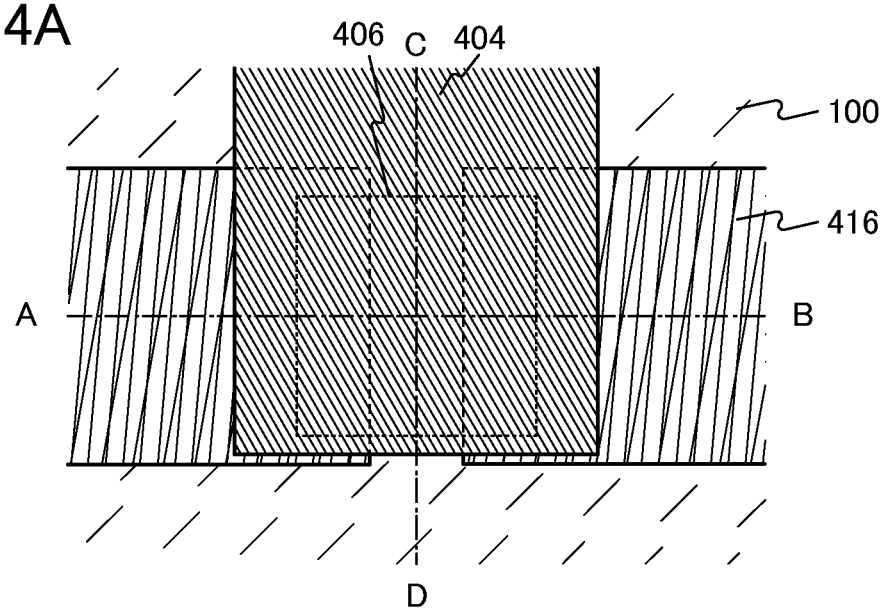
FIGS. 4A to 4C are a top view and cross-sectional views illustrating an example of a transistor according to an embodiment of the present invention.
Figure 4B:
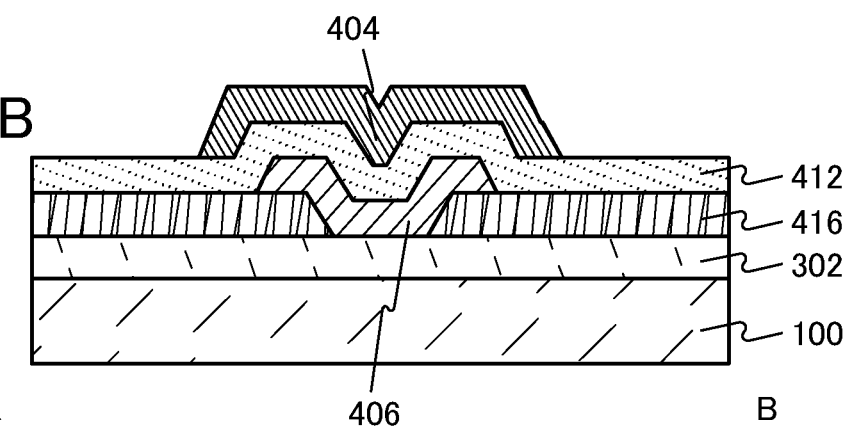
Figure 4C:
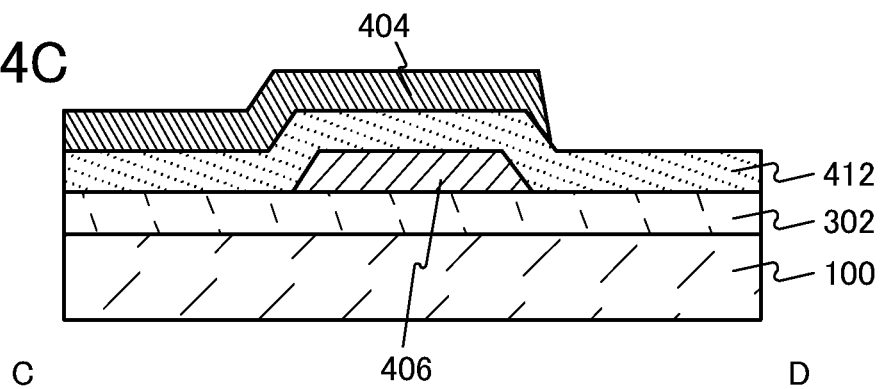

FIGS. 4A to 4C are a top view and cross-sectional views of a transistor according to an embodiment of the present invention. A cross section along dashed-dotted line A-B in FIG. 4A and a cross section along dashed-dotted line C-D in FIG. 4A correspond to a cross section A-B in FIG. 4B and a cross section C-D in FIG. 4C, respectively.

The cross section A-B in FIG. 4B will be described in detail below.

The transistor illustrated in FIG. 4B includes a pair of electrodes 416 over a base insulating film 302 provided over a substrate 100, an oxide semiconductor film 406 which is over the pair of electrodes 416 and partly in contact with the pair of electrodes 416, a gate insulating film 412 covering the oxide semiconductor film 406 and the pair of electrodes 416, and a gate electrode 404 provided over the oxide semiconductor film 406 with the gate insulating film 412 interposed therebetween. Here, the pair of electrodes 416, the oxide semiconductor film 406, the gate electrode 404, and the gate insulating film 412 may be formed using materials and methods similar to those of the pair of electrodes 116, the oxide semiconductor film 106, the gate electrode 104, and the gate insulating film 112 described in Embodiment 1, respectively.

Note that in FIGS. 2A to 2C, FIGS. 3A to 3C, and FIGS. 4A to 4C, the lateral length and the longitudinal length of the gate electrode are larger than those of the oxide semiconductor film in the top view in order to prevent light from causing deterioration of the oxide semiconductor film or electric charge generation in the oxide semiconductor film; however, the present invention is not limited to this structure. The lateral length and the longitudinal length of the oxide semiconductor film in the top view may be larger than those of the gate electrode.

Figure 5A:
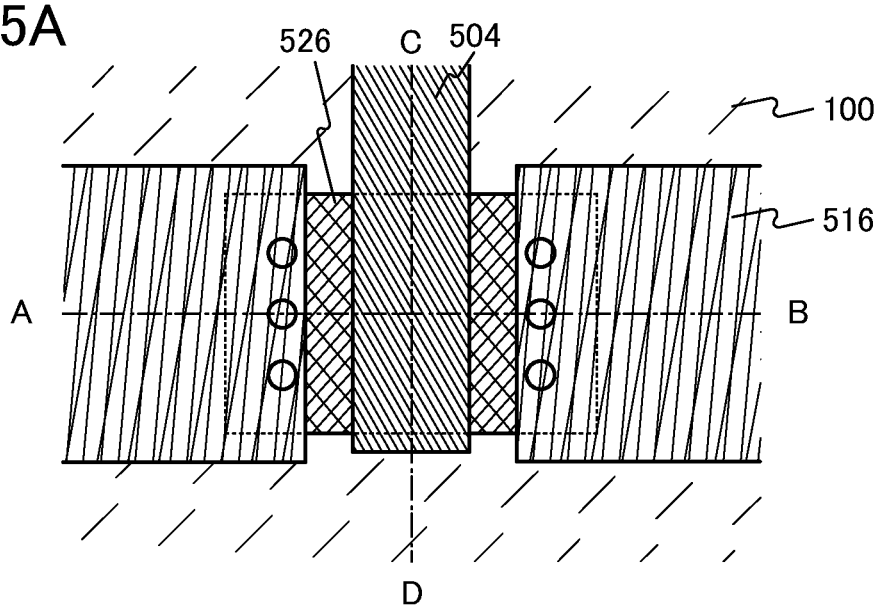
FIGS. 5A to 5C are a top view and cross-sectional views illustrating an example of a transistor according to an embodiment of the present invention.
Figure 5B:
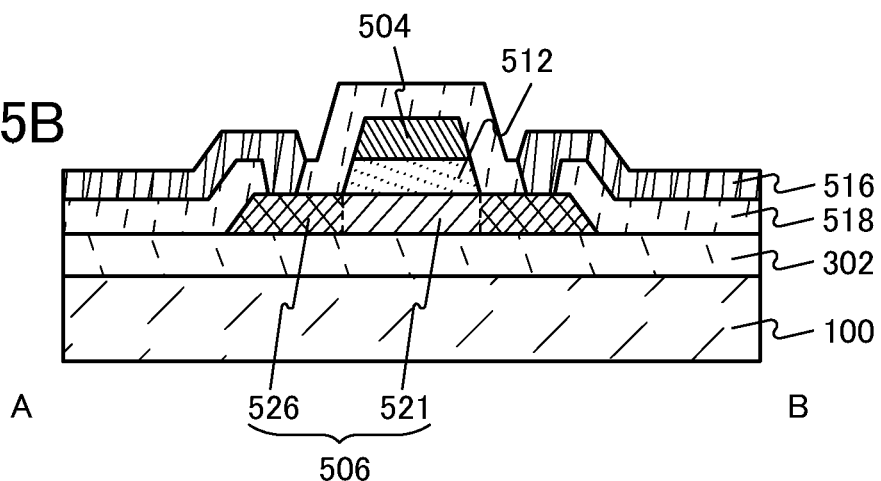
Figure 5C:
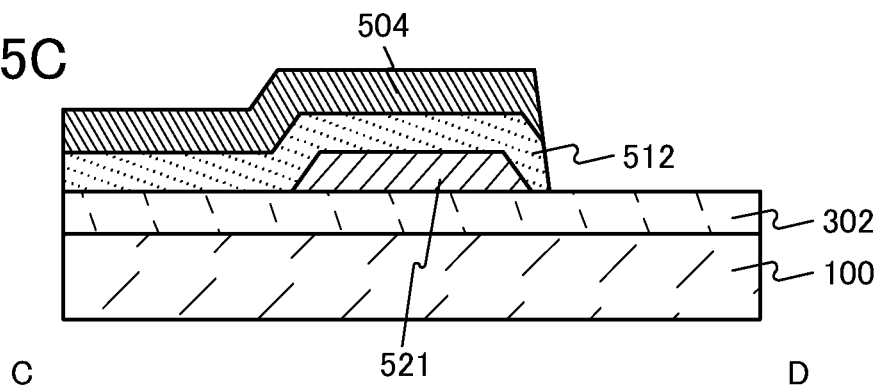

FIGS. 5A to 5C are a top view and cross-sectional views of a transistor according to an embodiment of the present invention. A cross section along dashed-dotted line A-B in FIG. 5A and a cross section along dashed-dotted line C-D in FIG. 5A correspond to a cross section A-B in FIG. 5B and a cross section C-D in FIG. 5C, respectively.

The cross section A-B in FIG. 5B will be described in detail below.

The transistor illustrated in FIG. 5B includes an oxide semiconductor film 506 including regions 526 and a region 521 over a base insulating film 302 provided over a substrate 100, a gate insulating film 512 over the region 521, a gate electrode 504 over the gate insulating film 512, an interlayer insulating film 518 covering the base insulating film 302, the regions 526, the gate insulating film 512, and the gate electrode 504, and a pair of electrodes 516 in contact with the regions 526 through opening portions which are provided in the interlayer insulating film 518 to expose the regions 526. Here, the pair of electrodes 516, the oxide semiconductor film 506, the gate electrode 504, the interlayer insulating film 518, and the gate insulating film 512 may be formed using materials and methods similar to those of the pair of electrodes 116, the oxide semiconductor film 106, the gate electrode 104, the interlayer insulating film 118, and the gate insulating film 112 described in Embodiment 1, respectively.

The gate insulating film 512 and the gate electrode 504 may have substantially the same top surface shape. This shape can be obtained by processing the gate electrode 504 and the gate insulating film 512 together with the use of one mask. Note that after formation of the gate electrode 504 and the gate insulating film 512, the width of the gate electrode 504 may be narrowed by performing plasma treatment or chemical treatment.

The region 521 may have substantially the same top surface shape as the gate insulating film 512 or the gate electrode 504. This shape is obtained by forming the regions 526 of the oxide semiconductor film 506 with the use of the gate insulating film 512 or the gate electrode 504 as a mask. For example, with the use of the gate insulating film 512 or the gate electrode 504 as a mask, an impurity (such as boron, phosphorus, hydrogen, a rare gas, or nitrogen) is introduced to the oxide semiconductor film 506, so that regions whose resistance is reduced are formed as the regions 526. Note that the region 521 is a region other than the regions 526 in the oxide semiconductor film 506.

The region 521 has a function as a channel formation region of the transistor. Further, the regions 526 have a function as a source region and a drain region of the transistor.

Figure 6A:
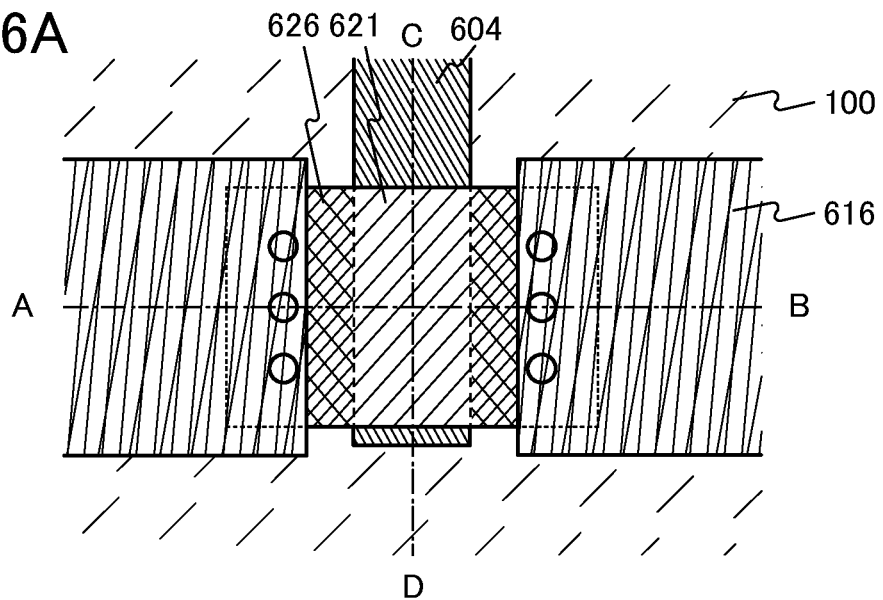
FIGS. 6A to 6C are a top view and cross-sectional views illustrating an example of a transistor according to an embodiment of the present invention.
Figure 6B:
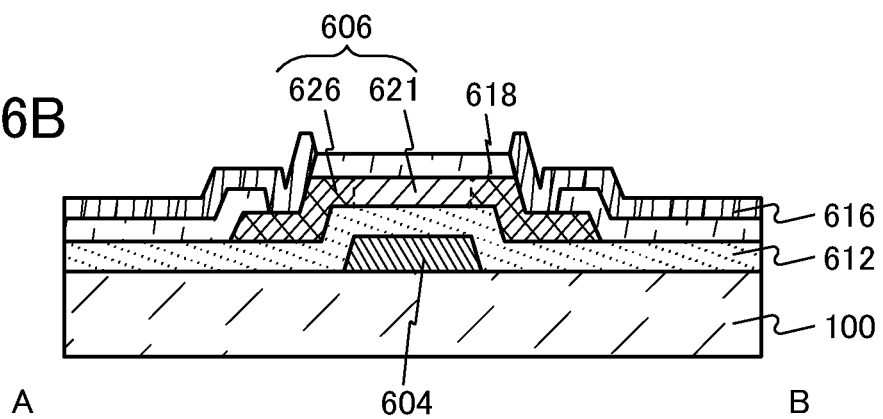
Figure 6C:
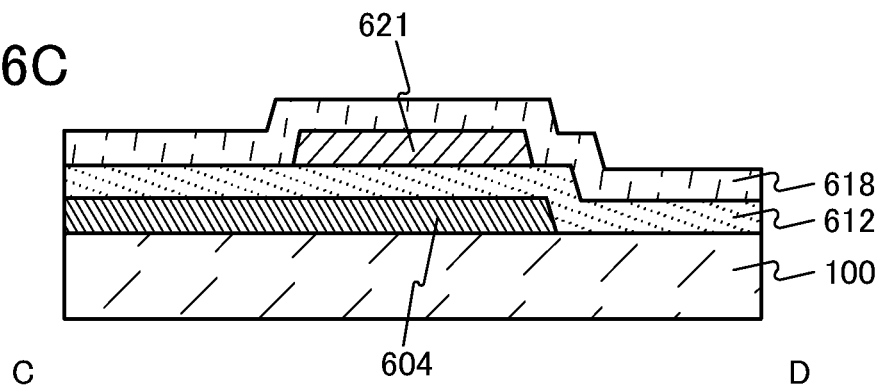

FIGS. 6A to 6C are a top view and cross-sectional views of a transistor according to an embodiment of the present invention. A cross section along dashed-dotted line A-B in FIG. 6A and a cross section along dashed-dotted line C-D in FIG. 6A correspond to a cross section A-B in FIG. 6B and a cross section C-D in FIG. 6C, respectively.

The cross section A-B in FIG. 6B will be described in detail below.

The transistor illustrated in FIG. 6B includes a gate electrode 604 over a substrate 100, a gate insulating film 612 covering the gate electrode 604, an oxide semiconductor film 606 which includes regions 626 and a region 621 and is provided over the gate electrode 604 with the gate insulating film 612 interposed therebetween, an interlayer insulating film 618 covering the oxide semiconductor film 606 and the gate insulating film 612, and a pair of electrodes 616 which are in contact with the regions 626 through opening portions which are provided in the interlayer insulating film 618 to expose the regions 626. Here, the pair of electrodes 616, the oxide semiconductor film 606, the gate electrode 604, the interlayer insulating film 618, and the gate insulating film 612 may be formed using materials and methods similar to those of the pair of electrodes 116, the oxide semiconductor film 106, the gate electrode 104, the interlayer insulating film 118, and the gate insulating film 112 described in Embodiment 1, respectively. Further, the region 621 and the regions 626 may each be formed using a material and a method similar to those of the region 521 and the regions 526.

In FIGS. 6A to 6C, the gate insulating film 612, the gate electrode 604, and the region 621 have substantially the same top surface shape; however, they are not limited thereto. The gate insulating film 612, the gate electrode 604, and the region 621 may have different shapes from each other.

In the above-described manner, a transistor whose threshold voltage is controlled can be provided. Therefore, a semiconductor device with low power consumption, favorable electric characteristics, and high reliability can be manufactured with high productivity.

This embodiment can be implemented in appropriate combination with the other embodiments.

Embodiment 3

In this embodiment, a liquid crystal display device manufactured using the transistor described in Embodiment 1 or 2 will be described. Note that although an example in which an embodiment of the present invention is applied to the liquid crystal display device is described in this embodiment, the present invention is not limited thereto. For example, application of an embodiment of the present invention to an electroluminescence (EL) display device is readily conceived by those skilled in the art.

FIG. 7 is a circuit diagram of an active matrix liquid crystal display device. The liquid crystal display device includes source lines SL_1 to SL_a, gate lines GL_1 to GL_b, and a plurality of pixels 200. Each pixel 200 includes a transistor 230, a capacitor 220, and a liquid crystal element 210. A plurality of the pixels 200 with such a structure form a pixel portion of the liquid crystal display device. In the case where the source line or the gate line is simply mentioned, it is denoted as the source line SL or the gate line GL.

The transistor described in Embodiment 1 or 2 is used as the transistor 230. With the use of the transistor according to an embodiment of the present invention, a liquid crystal display device with low power consumption and high reliability can be obtained.

The gate line GL is connected to a gate of the transistor 230, the source line SL is connected to a source of the transistor 230, and a drain of the transistor 230 is connected to one of capacitor electrodes of the capacitor 220 and one of pixel electrodes of the liquid crystal element 210. The other of the capacitor electrodes of the capacitor 220 and the other of the pixel electrodes of the liquid crystal element 210 are each connected to a common electrode. Note that the common electrode may be formed using the same material and in the same layer as the gate line GL.

Further, the gate line GL is connected to a gate driver circuit. The gate driver circuit may include the transistor described in Embodiment 1 or 2. Since the threshold voltage of the transistor is controlled, the off-state current can be decreased, and a voltage for turning on the transistor can be low. Thus, power consumption can be reduced.

The source line SL is connected to a source driver circuit. The source driver circuit may include the transistor described in Embodiment 1 or 2. Since the threshold voltage of the transistor is controlled, the off-state current can be decreased, and a voltage for turning on the transistor can be low. Thus, power consumption can be reduced.

One of or both the gate driver circuit and the source driver circuit may be formed over a substrate which is separately prepared and connected by a connection method such as a chip on glass (COG) method, a wire bonding method, or a tape automated bonding (TAB) method.

Since a transistor is easily broken by static electricity or the like, a protection circuit is preferably provided. The protection circuit is preferably formed using a nonlinear element.

On application of a potential that is higher than or equal to the threshold voltage of the transistor 230 to the gate line GL, electric charge supplied from the source line SL flows as a drain current of the transistor 230 and is accumulated in the capacitor 220. After charging for one row, the transistors 230 in the row are turned off and voltage application from the source line SL stops; however, a necessary voltage can be kept by the electric charge accumulated in the capacitors 220. Then, charging of the capacitors 220 in the next row starts. In this manner, charging for the first row to the b-th row is carried out.

Note that in the case where a transistor whose off-state current is small is used as the transistor 230, a time period during which the voltage is held can be longer. By this effect, the frequency of rewriting display can be reduced in the case of an image with little motion (including a still image); thus, a further reduction in power consumption can be achieved. In addition, the capacitance of the capacitor 220 can be further reduced, so that power consumption needed for charging can be reduced.

As described above, according to an embodiment of the present invention, a liquid crystal display device with high reliability and low power consumption can be obtained.

This embodiment can be implemented in appropriate combination with the other embodiments.

Embodiment 4

In this embodiment, an example of manufacturing a semiconductor memory device using the transistor described in Embodiment 1 or 2 will be described.

Typical examples of a volatile semiconductor memory device include a dynamic random access memory (DRAM) which stores data by selecting a transistor included in a memory element and accumulating electric charge in a capacitor and a static random access memory (SRAM) which holds stored data using a circuit such as a flip-flop.

Typical examples of a nonvolatile semiconductor memory device include a flash memory which has a floating gate between a gate electrode and a channel formation region of a transistor and stores data by holding electric charge in the floating gate.

The transistor described in Embodiment 1 or 2 can be applied to part of transistors included in the above-described semiconductor memory device.

First, a memory cell which is a DRAM to which the transistor described in Embodiment 1 or 2 is applied will be described with reference to FIGS. 8A and 8B.

Figure 8A:
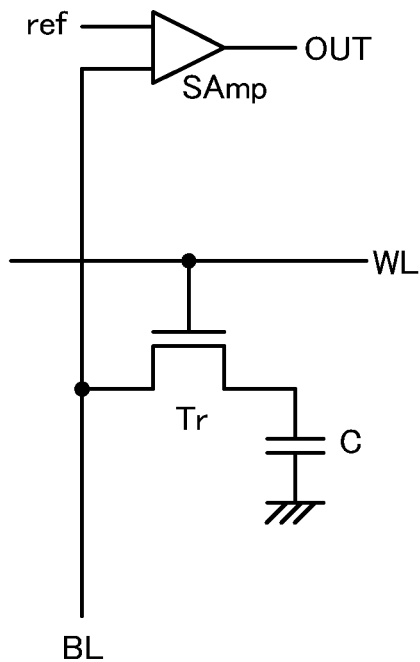
FIG. 8A is a circuit diagram showing an example of a semiconductor memory device including a transistor according to an embodiment of the present invention and FIG. 8B is a graph showing electric characteristics thereof.

A memory cell illustrated in FIG. 8A includes a bit line BL, a word line WL, a sense amplifier SAmp, a transistor Tr, and a capacitor C.

Figure 8B:
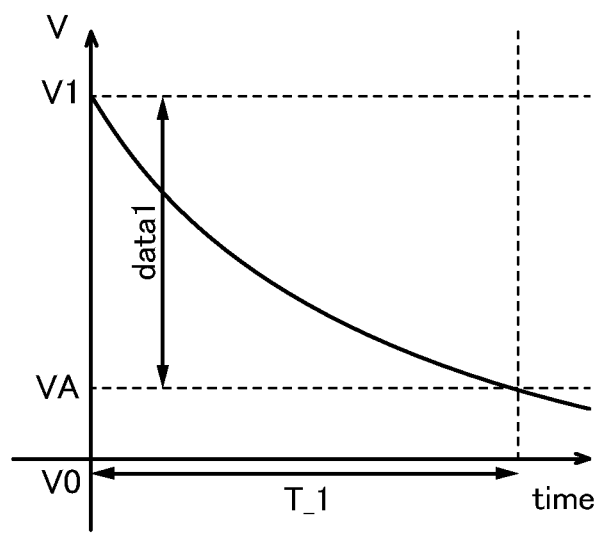

A potential held in the capacitor C is gradually decreased with time as shown in FIG. 8B owing to the off-state current of the transistor Tr. A potential originally charged from V0 to V1 is decreased with time, to VA that is a limit for reading out data 1. This period is called a holding period T_1. In the case of a two-level memory cell, refresh operation needs to be performed within the holding period T_1.

Here, the transistor described in Embodiment 1 or 2 is used as the transistor Tr. Since the threshold voltage of the transistor is controlled and the off-state current of the transistor is small, the holding period T_1 can be long. That is, frequency of the refresh operation can be reduced, which results in a reduction in power consumption. For example, by employing a transistor in which a highly purified oxide semiconductor film is included and the off-state current is less than or equal to $1 \times 10^{-21}$ A, preferably less than or equal to $1 \times 10^{-24}$ A, data can be held in the capacitor C for several days to several decades without supply of electric power.

As described above, by employing the transistor according to an embodiment of the present invention, a semiconductor memory device with high reliability and low power consumption can be obtained.

Next, a nonvolatile memory to which the transistor described in Embodiment 1 or 2 is applied will be described with reference to FIGS. 9A and 9B.

Figure 9A:
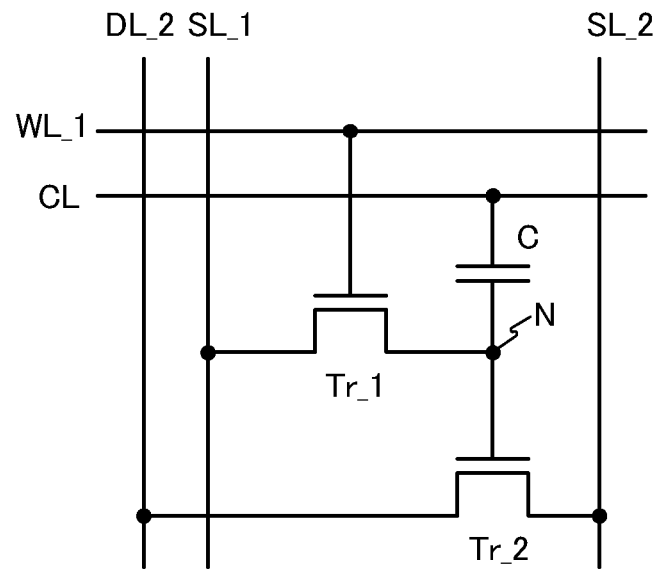
FIG. 9A is a circuit diagram showing an example of a semiconductor memory device including a transistor according to an embodiment of the present invention and FIG. 9B is a graph showing electric characteristics thereof.
Figure 9B:
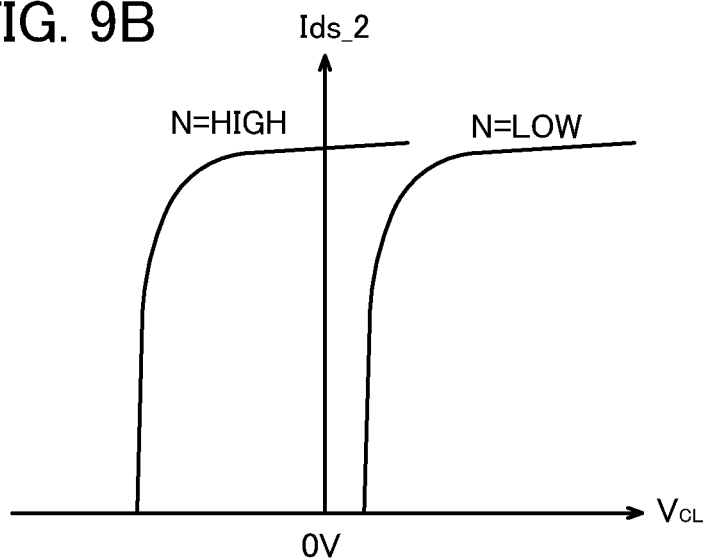

FIG. 9A is a circuit diagram of a nonvolatile memory. The nonvolatile memory includes a transistor Tr_1, a word line WL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor wiring CL connected to one terminal of the capacitor C, and a node N connected to the other terminal of the capacitor C, a drain of the transistor Tr_1, and a gate of the transistor Tr_2.

The nonvolatile memory described in this embodiment utilizes change in the threshold voltage of the transistor Tr_2, which depends on the potential of the node N. FIG. 9B shows a relation between a potential $V_{CL}$ of the capacitor wiring CL and a drain current Ids_2 flowing through the transistor Tr_2.

The potential of the node N can be adjusted by accumulating or releasing electric charge in the capacitor C through the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-Ids_2 curve (N=LOW) or a $V_{CL}$-Ids_2 curve (N=HIGH) is obtained. That is, when N=LOW, Ids_2 is small at a $V_{CL}$ of 0V; accordingly, data 0 is stored. Further, when N=HIGH, Ids_2 is large at a $V_{CL}$ of 0V; accordingly, data 1 is stored. In such a manner, data can be stored.

Here, the transistor described in Embodiment 1 or 2 is applied to the transistor Tr_1. Since the off-state current of the transistor can be very small, electric charge accumulated in the capacitor C can be prevented from leaking without intension through the transistor Tr_1. As a result, data can be held for a long time. Further, since the threshold voltage of the transistor Tr_1 in accordance with an embodiment of the present invention is controlled, a voltage needed for writing can be reduced, and thus, power consumption can be less than that of a flash memory or the like.

Note that the transistor described in Embodiment 1 or 2 may be applied to the transistor Tr_2.

Next, a configuration of the nonvolatile memory shown in FIG. 9A without the capacitor C will be described with reference to FIG. 10.

Figure 10:
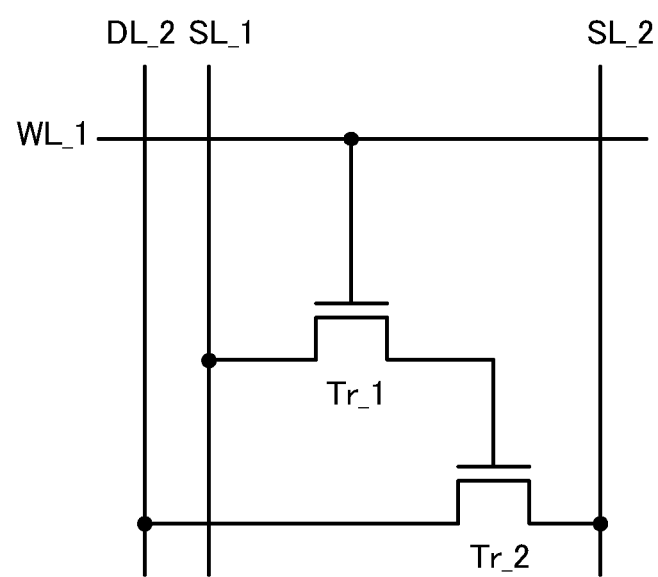
FIG. 10 is a circuit diagram showing an example of a semiconductor memory device including a transistor according to an embodiment of the present invention.

FIG. 10 is a circuit diagram of a nonvolatile memory. The nonvolatile memory includes a transistor Tr_1, a word line WL_1 connected to a gate of the transistor Tr_1, a source wiring SL_1 connected to a source of the transistor Tr_1, a transistor Tr_2, a source wiring SL_2 connected to a source of the transistor Tr_2, a drain line DL_2 connected to a drain of the transistor Tr_2, and a gate of the transistor Tr_2 connected to a drain of the transistor Tr_1.

In the case where a transistor whose off-state current is small is used as the transistor Tr_1, electric charge can be held between the drain of the transistor Tr_1 and the gate of the transistor Tr_2 without the capacitor C. The configuration without the capacitor C makes it possible to reduce the area of a memory, and the integration degree can be more increased than that of the configuration with a capacitor.

Although the nonvolatile memory including four or five wirings is described in this embodiment, a configuration of the nonvolatile memory is not limited thereto. For example, a configuration in which one wiring functions as the source line SL_1 and the drain line DL_2 may be employed.

As described above, according to an embodiment of the present invention, a semiconductor memory device with high reliability for a long time and low power consumption can be obtained.

This embodiment can be implemented in appropriate combination with the other embodiments.

Embodiment 5

A central processing unit (CPU) can be formed using the transistor described in Embodiment 1 or 2 for at least part of the CPU.

Figure 11A:
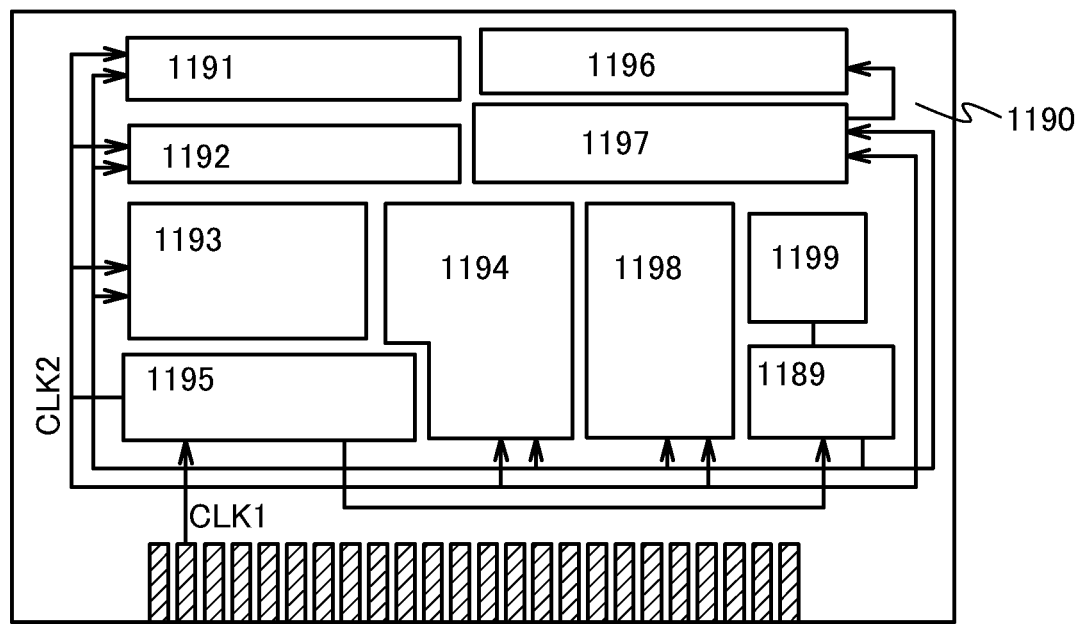
FIG. 11A is a block diagram showing a specific example of a CPU including a transistor according to an embodiment of the present invention and FIGS. 11B and 11C are circuit diagrams each illustrating part of the CPU.

FIG. 11A is a block diagram illustrating a specific structure of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Needless to say, the CPU illustrated in FIG. 11A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generation portion for generating an internal clock signal CLK2 based on a reference clock signal CLK1, and supplies the clock signal CLK2 to the above circuits.

In the CPU illustrated in FIG. 11A, a memory element is provided in the register 1196. The semiconductor memory device described in Embodiment 4 can be used as the memory element provided in the register 1196.

In the CPU illustrated in FIG. 11A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 11B:
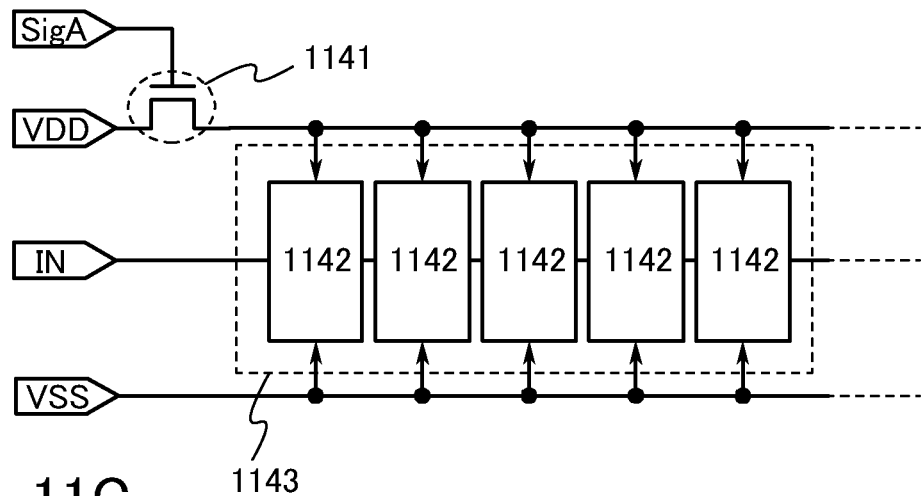
Figure 11C:
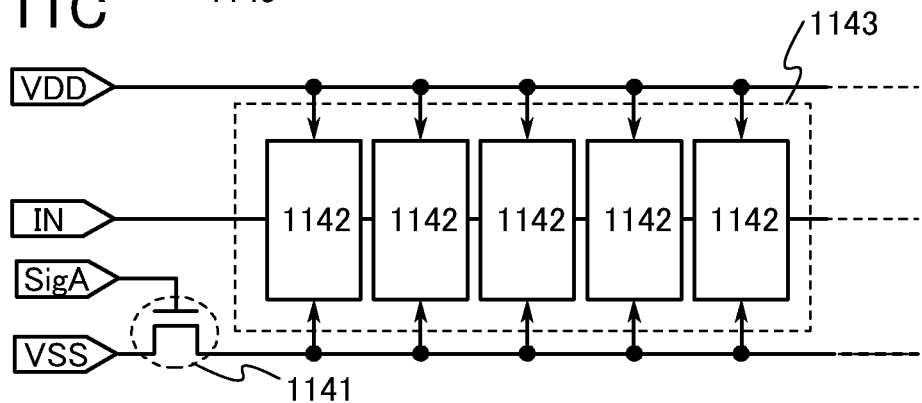

The supply of the power supply voltage can be stopped by providing a switching element between a memory element group and a node to which a power supply potential VDD or a power supply potential VSS is supplied, as illustrated in FIG. 11B or FIG. 11C. Circuits illustrated in FIGS. 11B and 11C will be described below.

FIGS. 11B and 11C each illustrate an example of a configuration of a memory circuit including a transistor described in Embodiment 1 or 2 as a switching element for controlling supply of a power supply potential to a memory element.

The memory device illustrated in FIG. 11B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 11B, the transistor described in Embodiment 1 or 2 is used as the switching element 1141, and the switching of the transistor is controlled by a signal SigA supplied to a gate electrode thereof.

Note that FIG. 11B illustrates the configuration in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 11B, the switching element 1141 may control the supply of the low-level power supply potential VSS.

In FIG. 11C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

Data can be held even in the case where a switching element is provided between a memory element group and a node to which the power supply potential VDD or the power supply potential VSS is supplied, an operation of a CPU is temporarily stopped, and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with the above-described embodiments.

Embodiment 6

In this embodiment, examples of an electronic device to which any of Embodiments 1 to 5 is applied will be described.

Figure 12A:
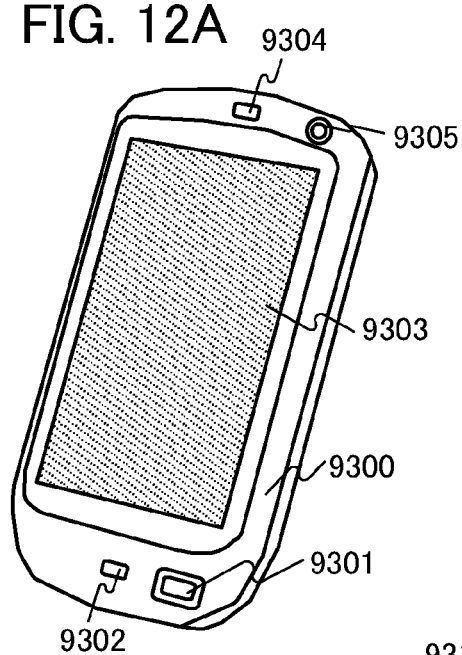
FIGS. 12A to 12C are perspective views each illustrating an example of an electronic device according to an embodiment of the present invention.

FIG. 12A illustrates a portable information terminal. The portable information terminal includes a housing 9300, a button 9301, a microphone 9302, a display portion 9303, a speaker 9304, and a camera 9305, and has a function as a mobile phone. The liquid crystal display device described in Embodiment 3 can be applied to the display portion 9303 and the camera 9305. Although not illustrated, the semiconductor device described in Embodiment 4 or 5 can be applied to an arithmetic device, a wireless circuit, or a memory circuit in a main body.

Figure 12B:
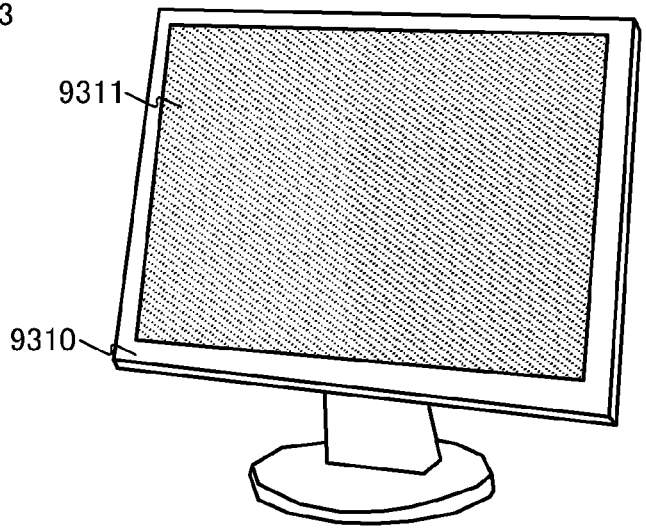

FIG. 12B illustrates a display which includes a housing 9310 and a display portion 9311. The liquid crystal display device described in Embodiment 3 can be applied to the display portion 9311. When the liquid crystal display device described in Embodiment 3 is employed, a display having high display quality can be provided even in the case where the size of the display portion 9311 is increased.

Figure 12C:
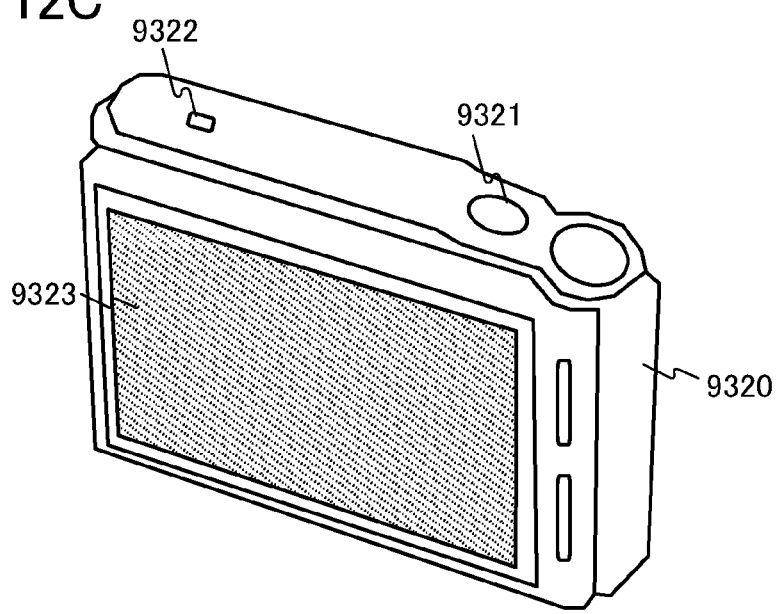
Figure 13A:
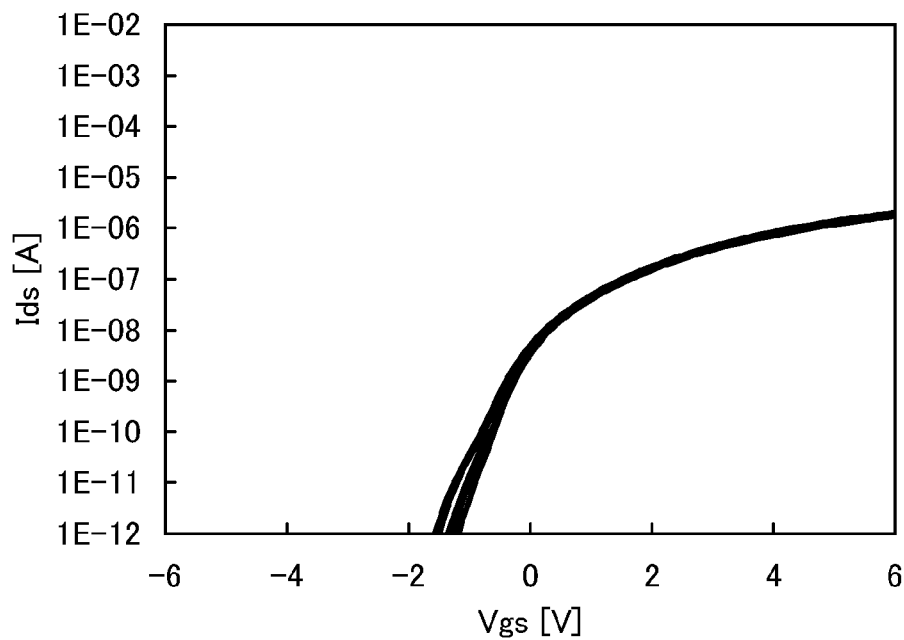
FIGS. 13A and 13B are graphs each showing an Ids-Vgs curve of a transistor according to an embodiment of the present invention.
Figure 13B:
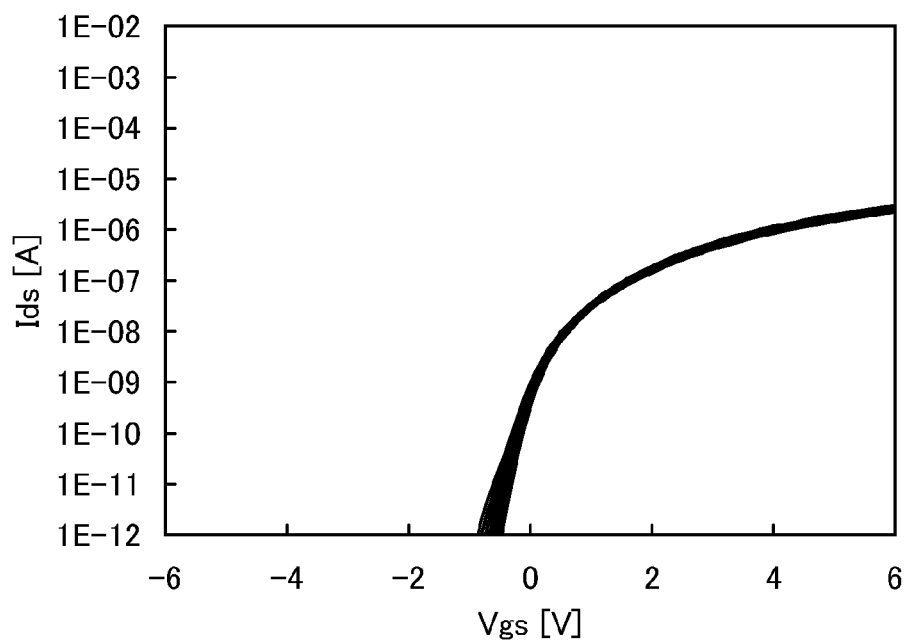
Figure 14A:
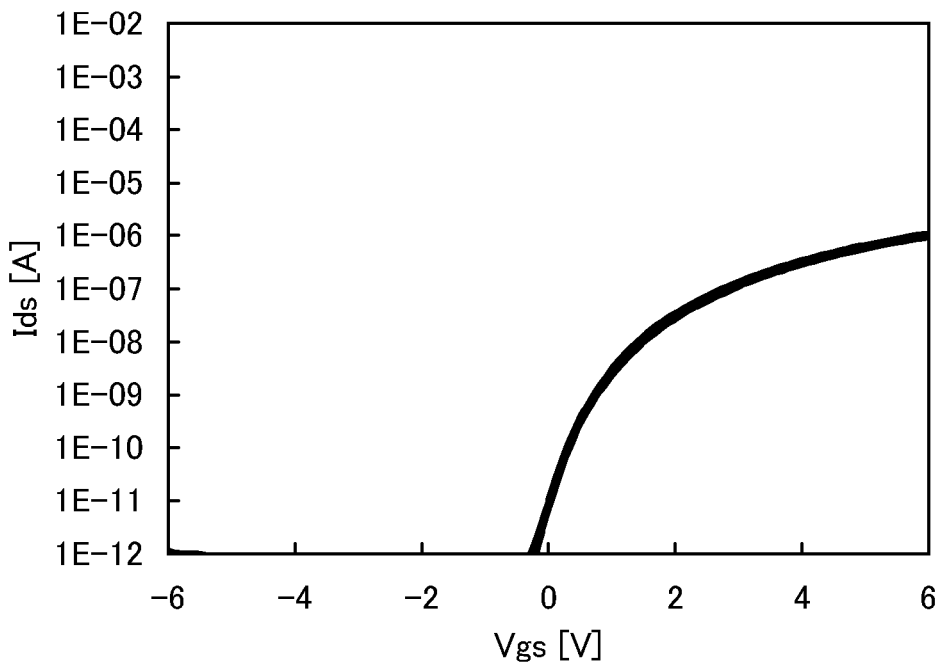
FIGS. 14A and 14B are graphs each showing an Ids-Vgs curve of a transistor according to an embodiment of the present invention.
Figure 14B:
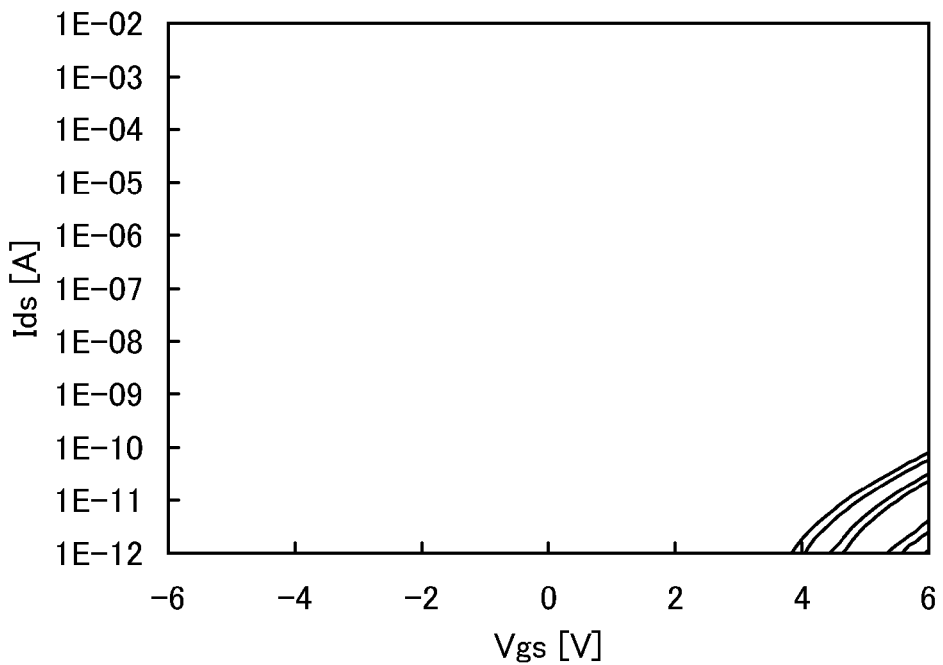

FIG. 12C illustrates a digital still camera. The digital still camera includes a housing 9320, a button 9321, a microphone 9322, and a display portion 9323. The liquid crystal display device described in Embodiment 3 can be applied to the display portion 9323. Although not illustrated, the semiconductor device described in Embodiment 4 or 5 can be applied to a memory circuit or an image sensor.

In accordance with this embodiment, the cost of the electronic devices can be reduced.

This embodiment can be implemented in appropriate combination with the other embodiments.

Example 1

In this example, the electric characteristics of transistors according to embodiments of the present invention, and TDS spectra, transmissivity, reflectivity, and X-ray diffraction (XRD) spectra of oxide semiconductor films included in the transistors will be described with reference to FIGS. 13A and 13B, FIGS. 14A and 14B, FIGS. 15A and 15B, FIGS. 16A and 16B, FIGS. 17A and 17B, FIGS. 18A and 18B, FIGS. 19A and 19B, FIGS. 20A and 20B, and FIGS. 21A and 21B. In addition, results of performing RBS and Hall effect measurement on the oxide semiconductor films included in the transistors are shown in Tables 1 to 3.

A transistor was manufactured by the following method.

First, over a glass substrate, a silicon oxynitride film was formed with a thickness of 100 nm as a base insulating film by a plasma CVD method.

Next, a tungsten film was formed with a thickness of 150 nm by a sputtering method and processed to form a gate electrode.

Then, a gate insulating film covering the base insulating film and the gate electrode was formed by a plasma CVD method.

After that, a titanium film was formed with a thickness of 100 nm by a sputtering method and processed to form a source electrode and a drain electrode.

Then, an In—Sn—Si—O film which was an n-type oxide semiconductor film containing NiO which was a p-type oxide semiconductor material was formed by a sputtering method and processed to form an oxide semiconductor film including a channel region. The In—Sn—Si—O film was formed in such a manner that an In—Sn—Si—O target (with a molar ratio of $In_2O_3:SnO_2:SiO_2=24:5:21$ and a circular shape with a diameter of 8 inches) was used and a sintered body of NiO was placed on the target in forming the film. Other film formation conditions were as follows: Ar with a flow of 10 sccm and $O_2$ with a flow of 5 sccm were used as a film formation gas, the distance between the target and the substrate was 170 mm, and electric power was 0.5 kW. Table 1 shows the results of evaluating the compositions of oxide semiconductor films each formed as described above using RBS as a single film. Samples 1 to 4 are different from each other in the amount of the sintered body of NiO on the target. Note that the oxide semiconductor films were each formed over a silicon wafer for performing the analysis easily. Since it is difficult to separate In and Sn in RBS, they are denoted by In+Sn.

TABLE 1

| | RBS composition [at. %] | | | | |
| --- | --- | --- | --- | --- | --- |
| | Si | In + Sn | O | Ni | Ar |
| Sample 1 | 8.8 | 25.3 | 65.4 | — | 0.5 |
| Sample 2 | 8.5 | 24.8 | 65.6 | 0.7 | 0.4 |
| Sample 3 | 8.3 | 23.5 | 65.1 | 2.7 | 0.4 |
| Sample 4 | 6.9 | 20.0 | 63.9 | 8.8 | 0.4 |

Then, the glass substrate was subjected to heat treatment at 350° C. for 1 hour in the air atmosphere (the volume ratio: $N_2:O_2=80:20$) in an electric furnace.

Through the above process, a transistor with a bottom-gate bottom-contact structure was manufactured.

FIG. 13A, FIG. 13B, FIG. 14A, and FIG. 14B respectively show curves of drain current (Ids) vs. gate voltage (Vgs) of transistors including the oxide semiconductor films of Samples 1, 2, 3, and 4. Measurement was performed on 15 points in a substrate plane under the condition that the drain voltage Vds was 3 V, the channel length (L) was 20 µm, and the channel width (W) was 20 µm.

From the obtained Ids-Vgs curves, it was found that the average threshold voltage in the case of using the oxide semiconductor film of Sample 1 was 0.41 V, the average threshold voltage in the case of using the oxide semiconductor film of Sample 2 was 0.82 V, and the average threshold voltage in the case of using the oxide semiconductor film of Sample 3 was 1.54 V. In the case of using the oxide semiconductor film of Sample 4, the transistor characteristics could not be obtained in the measurement range. The above results show that the threshold voltage of the transistor can be controlled when NiO that is a p-type oxide semiconductor material is contained in an n-type oxide semiconductor film and that when the Ni is contained at higher than or equal to 8.8 at. %, the transistor characteristics cannot be obtained.

Then, the physical properties of the oxide semiconductor films used for the transistors were each evaluated as a single film.

Figure 15A:
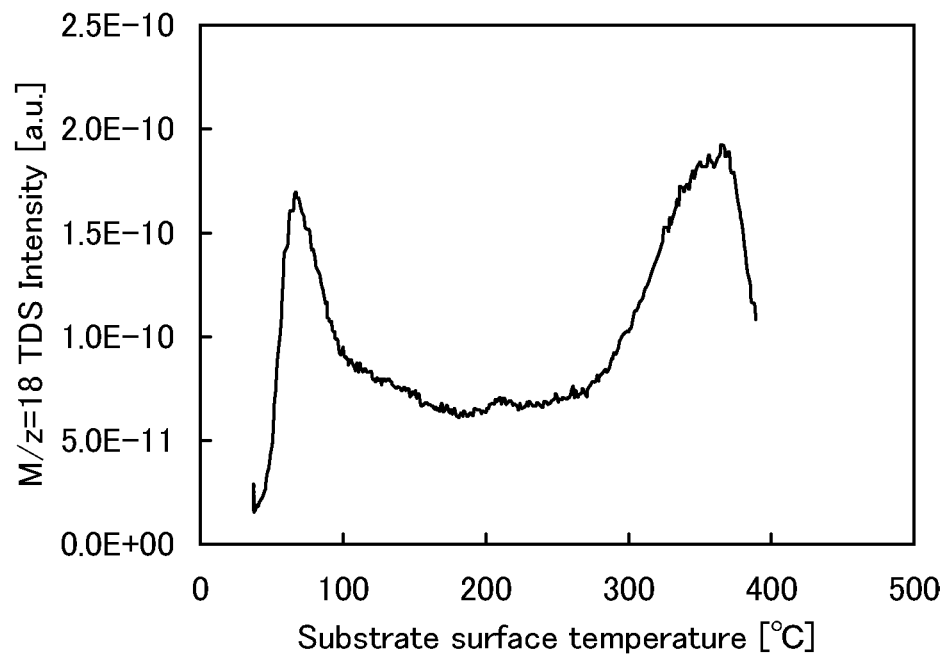
FIGS. 15A and 15B are graphs each showing a TDS spectrum of an oxide semiconductor film according to an embodiment of the present invention.
Figure 15B:
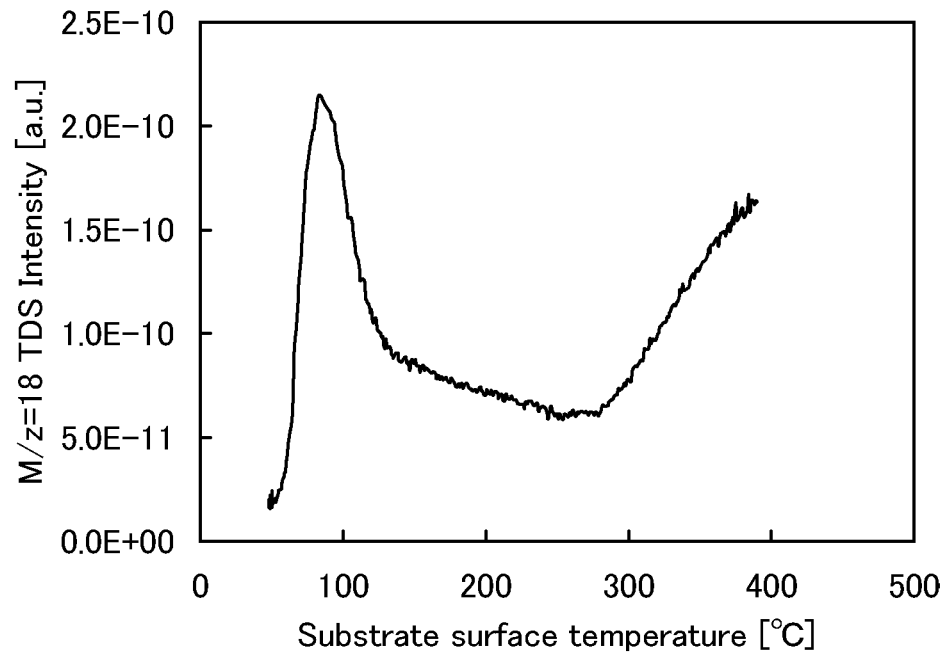

FIGS. 15A and 15B show TDS spectra of the oxide semiconductor films corresponding to Samples 1 and 4 in which M/z=18 and which are formed over a glass substrate. FIG. 15A shows a TDS spectrum of Sample 1 and FIG. 15B shows a TDS spectrum of Sample 4. Sample 1 has a peak 1 in the range of 70° C. to 100° C. and a peak 2 in the range of 340° C. to 380° C. Sample 4 has a peak 1 in the temperature range similar to that of Sample 1 but it is estimated that it has a peak 2 in the range of higher than or equal to 380° C. which is not in the measurement range. That is, desorption of $H_2O$ or the like in which M/z=18 is less likely to be caused in Sample 4 than in Sample 1 when heat treatment is performed on Samples 1 and 4 under the same condition. This is attributed to NiO which is a p-type oxide semiconductor material contained in Sample 4.

Figure 16A:
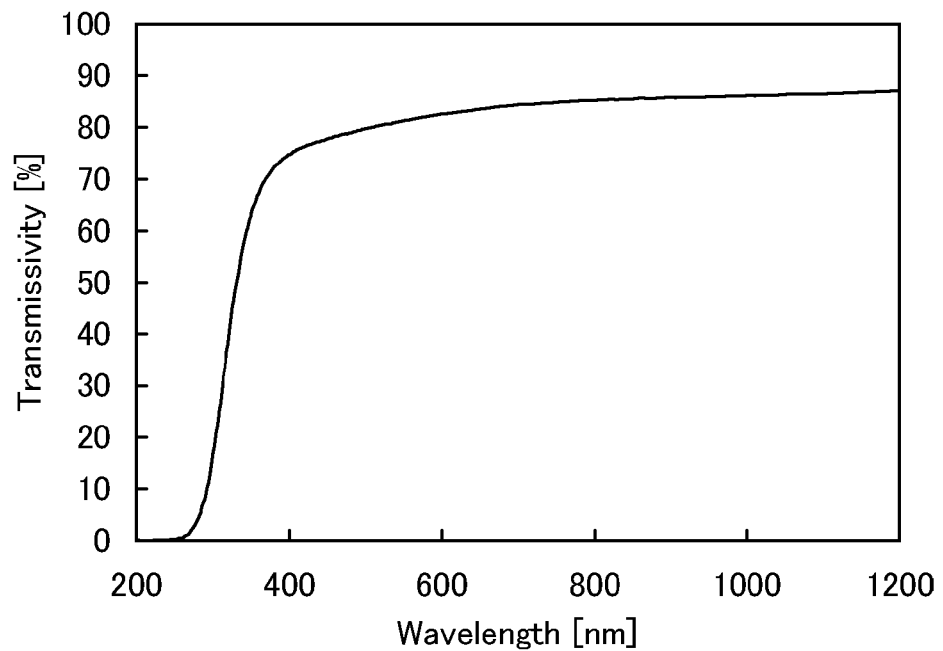
FIG. 16A is a graph showing transmissivity of an oxide semiconductor film according to an embodiment of the present invention and FIG. 16B is a graph showing reflectivity of an oxide semiconductor film according to an embodiment of the present invention.
Figure 16B:
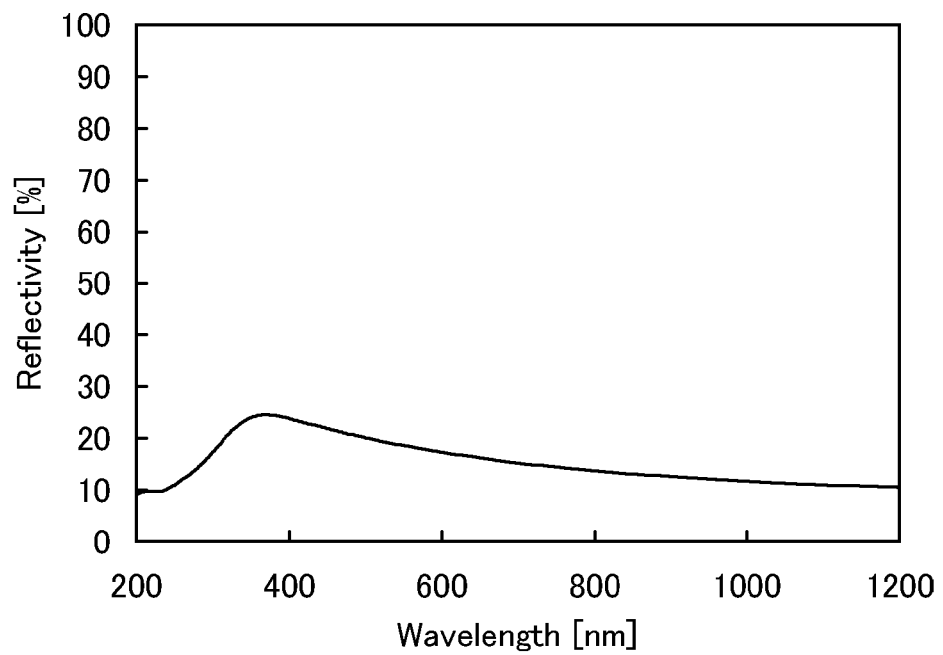
Figure 17A:
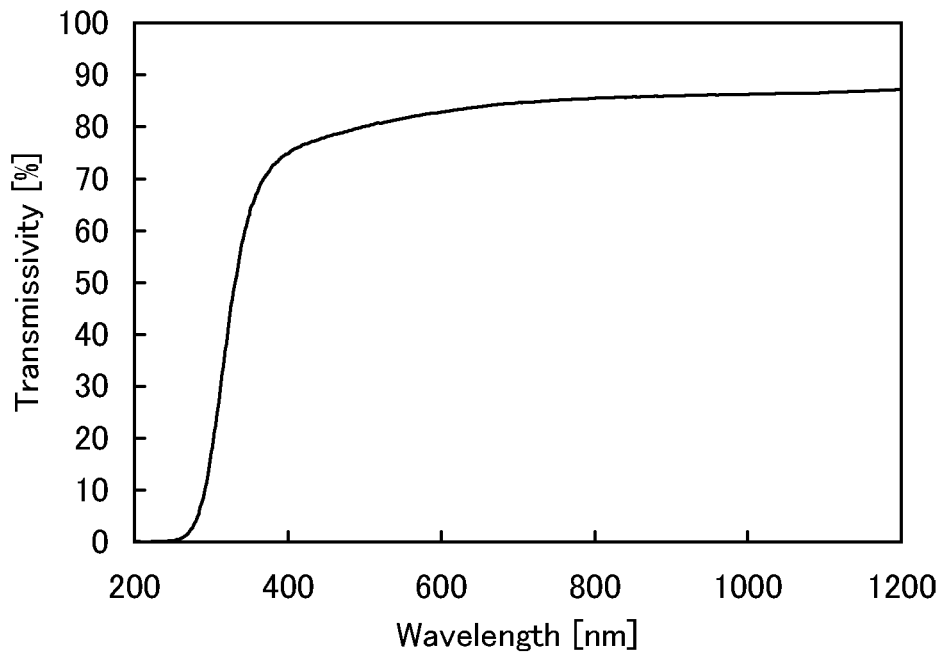
FIG. 17A is a graph showing transmissivity of an oxide semiconductor film according to an embodiment of the present invention and FIG. 17B is a graph showing reflectivity of an oxide semiconductor film according to an embodiment of the present invention.
Figure 17B:
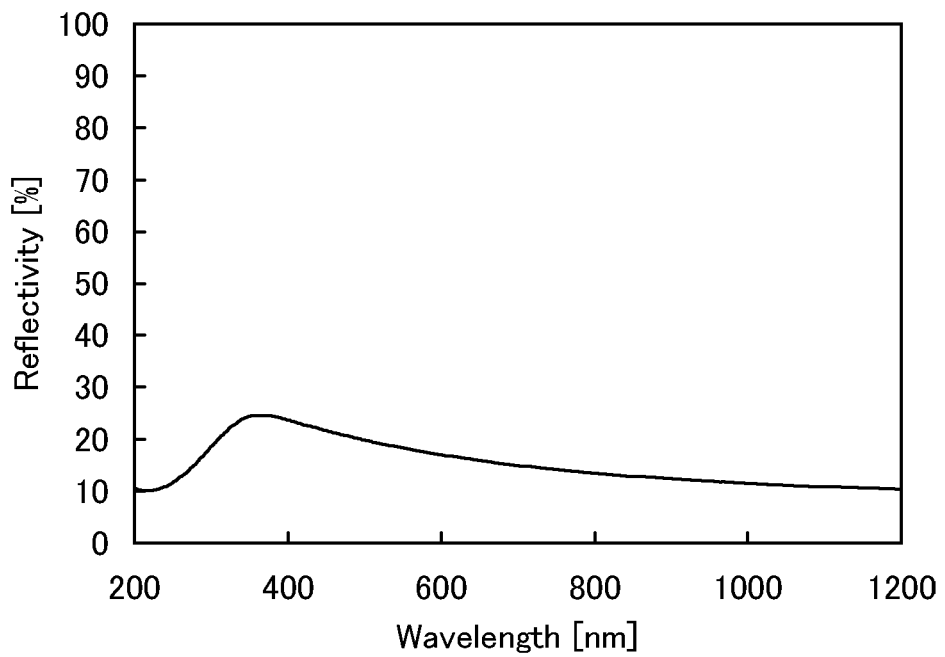
Figure 18A:
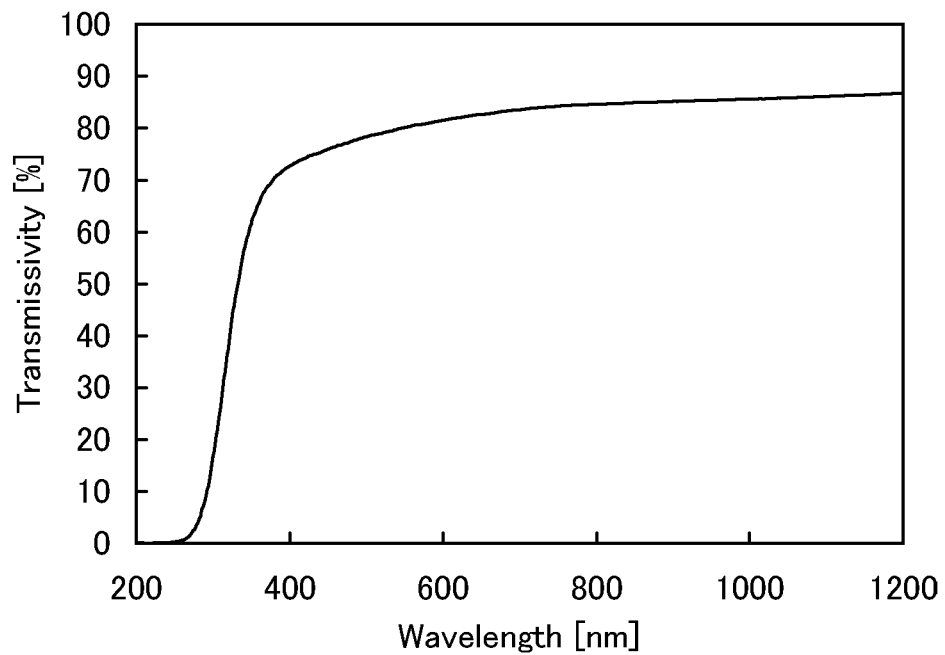
FIG. 18A is a graph showing transmissivity of an oxide semiconductor film according to an embodiment of the present invention and FIG. 18B is a graph showing reflectivity of an oxide semiconductor film according to an embodiment of the present invention.
Figure 18B:
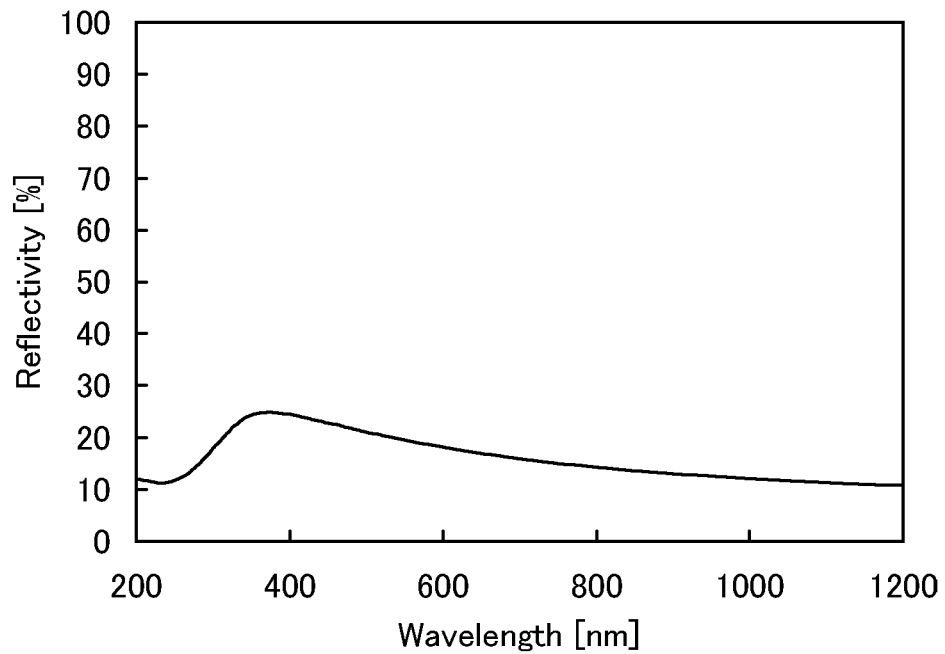
Figure 19A:
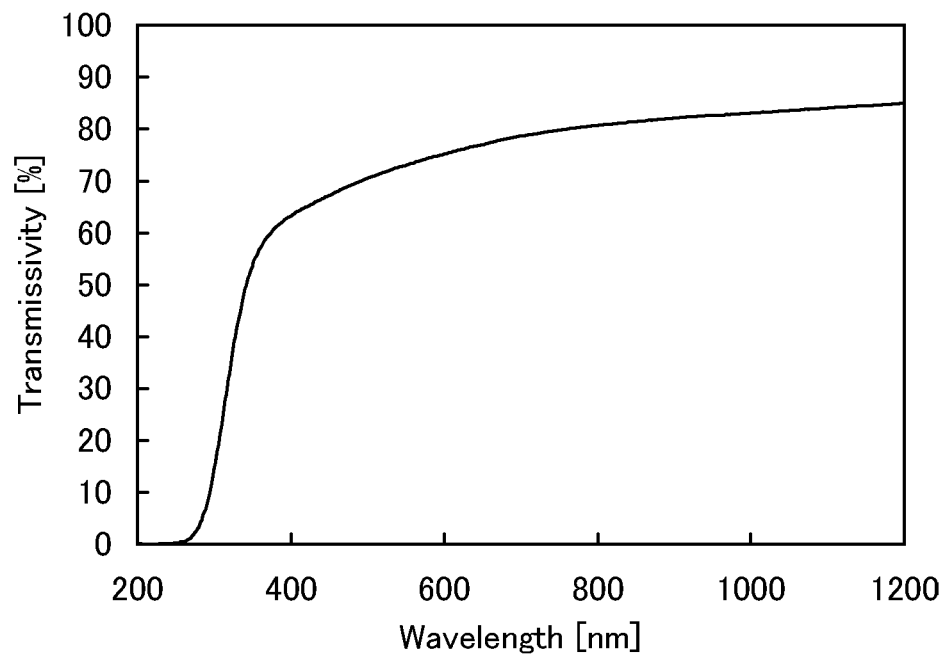
FIG. 19A is a graph showing transmissivity of an oxide semiconductor film according to an embodiment of the present invention and FIG. 19B is a graph showing reflectivity of an oxide semiconductor film according to an embodiment of the present invention.
Figure 19B:
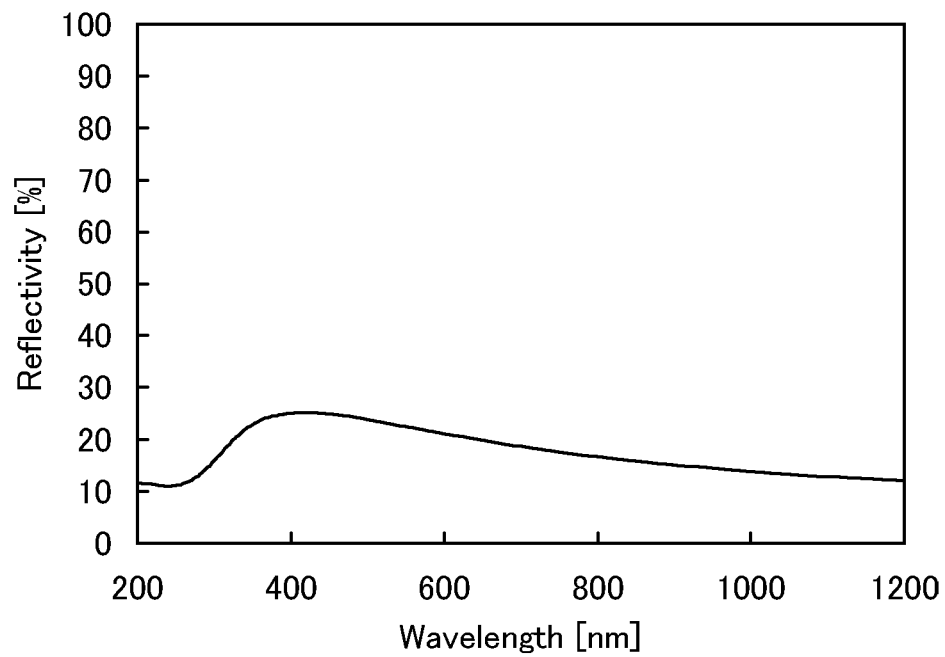
Figure 20A:
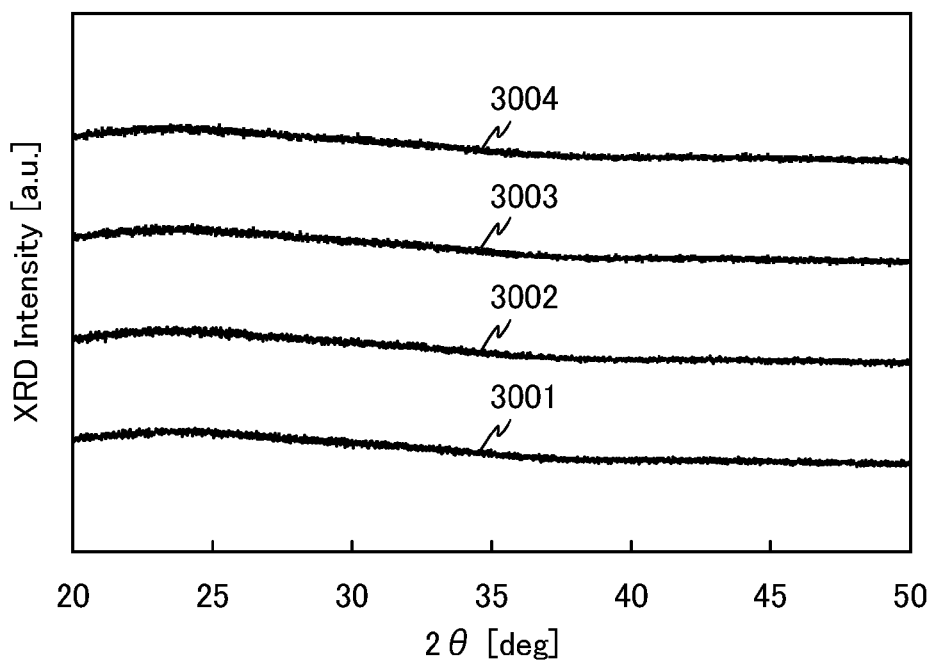
FIGS. 20A and 20B are graphs each showing an XRD spectrum of an oxide semiconductor film according to an embodiment of the present invention.
Figure 20B:
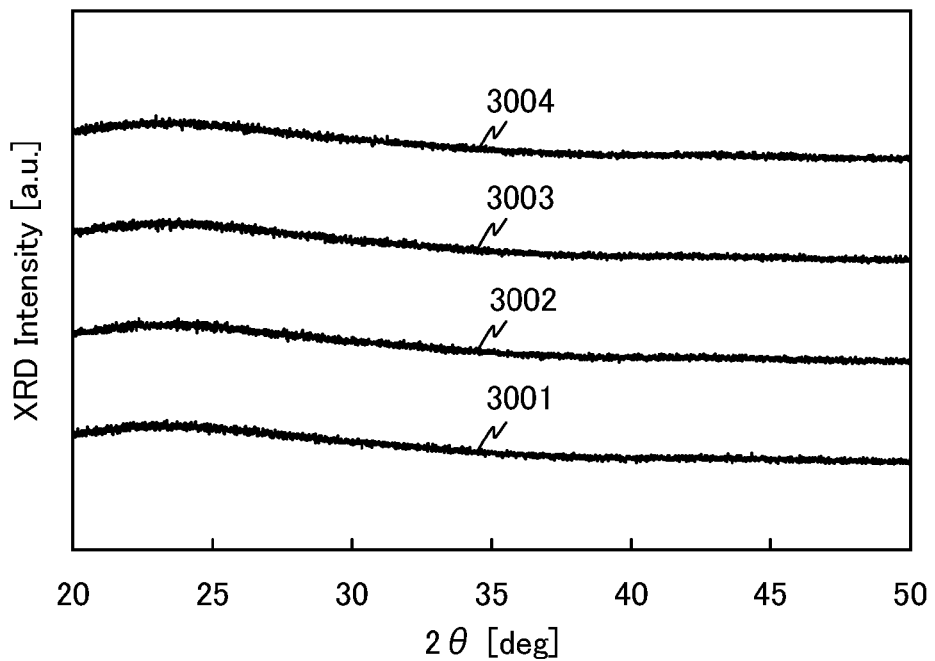
Figure 21A:
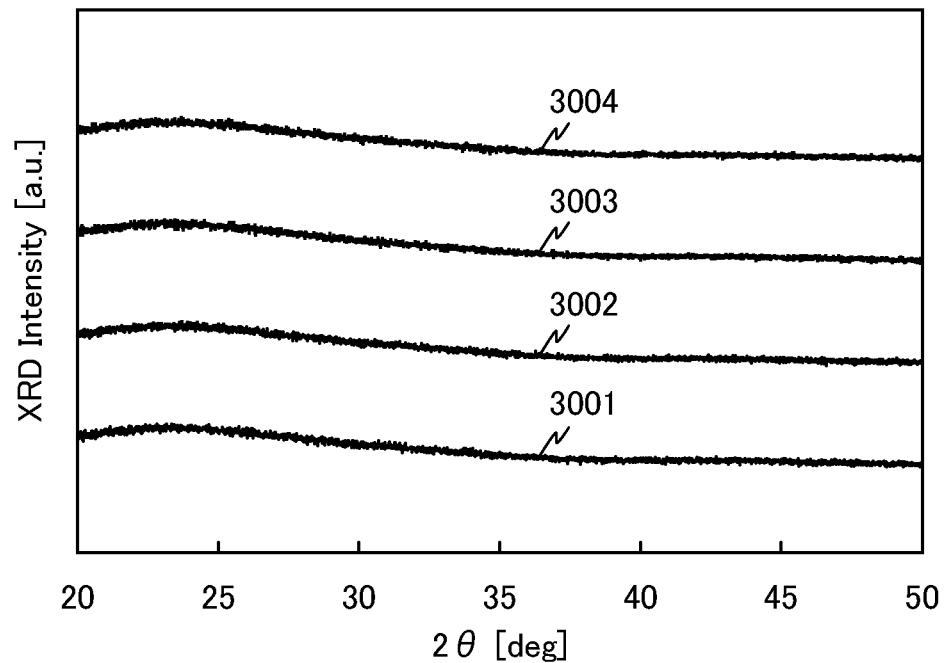
FIGS. 21A and 21B are graphs each showing an XRD spectrum of an oxide semiconductor film according to an embodiment of the present invention.
Figure 21B:
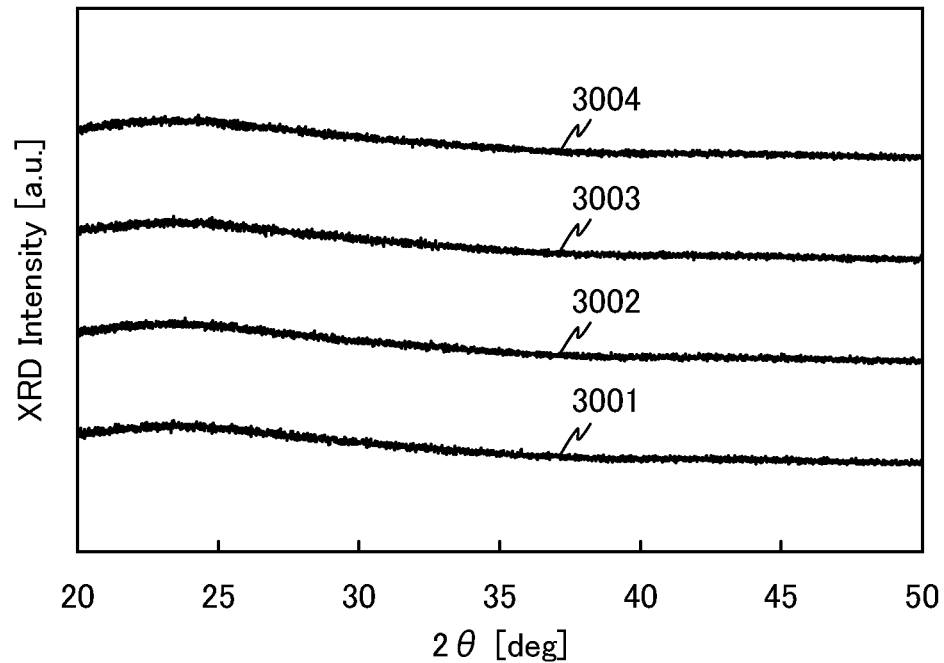

FIGS. 16A and 16B, FIGS. 17A and 17B, FIGS. 18A and 18B, and FIGS. 19A and 19B show transmissivity and reflectivity of the oxide semiconductor films corresponding to Samples 1 to 4, respectively. The transmissivity and reflectivity were measured with the use of a spectrophotometer, U-4000, manufactured by Hitachi High-Technologies Corporation. FIGS. 16A and 16B show transmissivity and reflectivity of Sample 1. FIGS. 17A and 17B show transmissivity and reflectivity of Sample 2. FIGS. 18A and 18B show transmissivity and reflectivity of Sample 3. FIGS. 19A and 19B show transmissivity and reflectivity of Sample 4. It was found that each sample has high transmissivity and is transparent in the visible light region.

Further, it was found that as the proportion of NiO was increased, the transmissivity in a short wavelength range (around 400 nm) was gradually decreased.

FIGS. 20A and 20B and FIGS. 21A and 21B show XRD spectra of the oxide semiconductor films corresponding to Samples 1 to 4 formed over a glass substrate. The XRD spectra were measured with the use of an X-ray diffractometer D8 ADVANCE manufactured by Bruker AXS. FIGS. 20A and 20B and FIGS. 21A and 21B show XRD spectra of Samples 1, 2, 3, and 4, respectively. In each graph, a solid line 3001 denotes the oxide semiconductor film which was not subjected to heat treatment or the like after being formed (as-depo), a solid line 3002 denotes the oxide semiconductor film which was subjected to heat treatment at 250° C. in a nitrogen atmosphere after being formed, a solid line 3003 denotes the oxide semiconductor film which was subjected to heat treatment at 350° C. in a nitrogen atmosphere after being formed, and a solid line 3004 denotes the oxide semiconductor film which was subjected to heat treatment at 450° C. in a nitrogen atmosphere after being formed. FIGS. 20A and 20B and FIGS. 21A and 21B show that each sample was not crystallized by the heat treatment described above and amorphous.

Table 2 and Table 3 show carrier density and Hall mobility respectively obtained by Hall effect measurement performed on the oxide semiconductor films corresponding to Samples 1 to 4 formed over a glass substrate. ResiTest8300 series manufactured by TOYO Corporation was used for the Hall effect measurement. In this example, Samples 1 to 4 subjected to heat treatment at 250° C., 350° C., or 450° C. in a nitrogen atmosphere after being formed were also evaluated. Note that a sample with very low conductivity could not be evaluated because of performance of the Hall effect measurement device (denoted by "-" in the tables).

TABLE 2

| | Carrier Density [cm$^{-3}$] | | | |
|---|---|---|---|---|
| Heat Treatment | Not Performed | 250° C. | 350° C. | 450° C. |
| Sample 1 | 6.7E+10 | 3.7E+15 | 1.5E+17 | 1.8E+18 |
| Sample 2 | — | — | 2.9E+15 | 4.4E+17 |
| Sample 3 | — | — | — | 8.2E+16 |
| Sample 4 | — | — | — | — |

TABLE 3

| | Hall Mobility [cm$^2$/Vs] | | | |
|---|---|---|---|---|
| Heat Treatment | Not Performed | 250° C. | 350° C. | 450° C. |
| Sample 1 | — | 1.9 | 1.7 | 2.5 |
| Sample 2 | — | — | 0.9 | 1.9 |
| Sample 3 | — | — | — | 2.0 |
| Sample 4 | — | — | — | — |

Table 2 shows a tendency in which the carrier (electron) density of the oxide semiconductor film was reduced as the proportion of NiO which is a p-type oxide semiconductor material was increased and a tendency in which the carrier density of the oxide semiconductor film was increased as the temperature of the heat treatment after the film formation was increased.

Table 3 shows that the Hall mobility of the oxide semiconductor films was in the range of 0.9 to 2.5 cm$^2$/Vs.

EXPLANATION OF REFERENCE

100: substrate, 104: gate electrode, 106: oxide semiconductor film, 112: gate insulating film, 116: pair of electrodes, 118: interlayer insulating film, 200: pixel, 206: oxide semiconductor film, 210: liquid crystal element, 216: pair of electrodes, 218: interlayer insulating film, 220: capacitor, 230: transistor, 302: base insulating film, 304: gate electrode, 306: oxide semiconductor film, 312: gate insulating film, 316: pair of electrodes, 404: gate electrode, 406: oxide semiconductor film, 412: gate insulating film, 416: pair of electrodes, 504: gate electrode, 506: oxide semiconductor film, 512: gate insulating film, 516: pair of electrodes, 518: interlayer insulating film, 521: region, region, 526: region, 604: gate electrode, 606: oxide semiconductor film, 612: gate insulating film, 616: pair of electrodes, 618: interlayer insulating film, 621: region, 626: region, 1141: switching element, 1142: memory element, 1143: memory element group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3001: solid line, 3002: solid line, 3003: solid line, 3004: solid line, 9300: housing, 9301: button, 9302: microphone, 9303: display portion, 9304: speaker, 9305: camera, 9310: housing, 9311: display portion, 9320: housing, 9321: button, 9322: microphone, 9323: display portion This application is based on Japanese Patent Application serial no. 2011-014652 filed with Japan Patent Office on Jan. 27, 2011, the entire contents of which are hereby incorporated by reference.

The invention claimed is:

1. A semiconductor device comprising:
   a gate electrode;
   a gate insulating film;
   a pair of electrodes; and
   an n-type oxide semiconductor film which overlaps with the gate electrode with the gate insulating film interposed therebetween and is in contact with the pair of electrodes,
   wherein the n-type oxide semiconductor film contains a p-type oxide semiconductor material, and
   wherein the n-type oxide semiconductor film comprises a channel formation region of a transistor, the channel formation region overlapping with the gate electrode.

2. The semiconductor device according to claim 1, wherein an atomic ratio of the p-type oxide semiconductor material to the n-type oxide semiconductor film is greater than or equal to 0.001 and less than or equal to 0.15.

3. The semiconductor device according to claim 2,
   wherein the n-type oxide semiconductor film further contains an insulating material, and
   wherein an atomic ratio of the insulating material to the n-type oxide semiconductor film is greater than or equal to 0.01 and less than or equal to 0.2.

4. The semiconductor device according to claim 3,
   wherein the insulating material comprises at least one of silicon oxide and germanium oxide.

5. The semiconductor device according to claim 1, wherein the n-type oxide semiconductor film comprises two or more kinds of elements selected from In, Ga, Zn, and Sn.

6. The semiconductor device according to claim 1, wherein the p-type oxide semiconductor material comprises at least one of Ni, La, Sr, Nd, Na, and Cu.

7. The semiconductor device according to claim 1, wherein the n-type oxide semiconductor film is amorphous.

8. The semiconductor device according to claim 1,
   wherein the n-type oxide semiconductor film further contains an insulating material, and
   wherein an atomic ratio of the insulating material to the n-type oxide semiconductor film is greater than or equal to 0.01 and less than or equal to 0.2.

9. The semiconductor device according to claim 8,
   vwherein the insulating material comprises at least one of silicon oxide and germanium oxide.

10. The semiconductor device according to claim 1, wherein the p-type oxide semiconductor material is contained in the n-type oxide semiconductor film at a time of forming the n-type oxide semiconductor film.

11. A semiconductor device comprising:
    a gate electrode;
    a gate insulating film;
    a pair of electrodes; and
    an n-type oxide semiconductor film which overlaps with the gate electrode with the gate insulating film interposed therebetween and is in contact with the pair of electrodes,
    wherein the n-type oxide semiconductor film contains a p-type oxide semiconductor material,
    wherein the pair of electrodes are in direct contact with a top surface of the n-type oxide semiconductor film, and wherein the n-type oxide semiconductor film comprises a channel formation region of a transistor, the channel formation region overlapping with the gate electrode.

12. The semiconductor device according to claim 11, wherein an atomic ratio of the p-type oxide semiconductor material to the n-type oxide semiconductor film is greater than or equal to 0.001 and less than or equal to 0.15.

13. The semiconductor device according to claim 12,
wherein the n-type oxide semiconductor film further contains an insulating material, and
wherein an atomic ratio of the insulating material to the n-type oxide semiconductor film is greater than or equal to 0.01 and less than or equal to 0.2.

14. The semiconductor device according to claim 13,
wherein the insulating material comprises at least one of silicon oxide and germanium oxide.

15. The semiconductor device according to claim 11, wherein the n-type oxide semiconductor film comprises two or more kinds of elements selected from In, Ga, Zn, and Sn.

16. The semiconductor device according to claim 11, wherein the p-type oxide semiconductor material comprises at least one of Ni, La, Sr, Nd, Na, and Cu.

17. The semiconductor device according to claim 11, wherein the n-type oxide semiconductor film is amorphous.

18. The semiconductor device according to claim 11,
wherein the n-type oxide semiconductor film further contains an insulating material, and
wherein an atomic ratio of the insulating material to the n-type oxide semiconductor film is greater than or equal to 0.01 and less than or equal to 0.2.

19. The semiconductor device according to claim 18,
wherein the insulating material comprises at least one of silicon oxide and germanium oxide.

20. The semiconductor device according to claim 11, wherein the p-type oxide semiconductor material is contained in the n-type oxide semiconductor film at a time of forming the n-type oxide semiconductor film.

21. A semiconductor device comprising:
a gate electrode;
a gate insulating film;
a pair of electrodes; and
an n-type oxide semiconductor film which overlaps with the gate electrode with the gate insulating film interposed therebetween and is in contact with the pair of electrodes,
wherein the n-type oxide semiconductor film contains a p-type oxide semiconductor material,
wherein the pair of electrodes are in direct contact with a top surface of the n-type oxide semiconductor film,
wherein the gate insulating film is in direct contact with a bottom surface of the n-type oxide semiconductor film, and
wherein the n-type oxide semiconductor film comprises a channel formation region of a transistor, the channel formation region overlapping with the gate electrode.

22. The semiconductor device according to claim 21, wherein an atomic ratio of the p-type oxide semiconductor material to the n-type oxide semiconductor film is greater than or equal to 0.001 and less than or equal to 0.15.

23. The semiconductor device according to claim 22,
wherein the n-type oxide semiconductor film further contains an insulating material, and
wherein an atomic ratio of the insulating material to the n-type oxide semiconductor film is greater than or equal to 0.01 and less than or equal to 0.2.

24. The semiconductor device according to claim 23,
wherein the insulating material comprises at least one of silicon oxide and germanium oxide.

25. The semiconductor device according to claim 21, wherein the n-type oxide semiconductor film comprises two or more kinds of elements selected from In, Ga, Zn, and Sn.

26. The semiconductor device according to claim 21, wherein the p-type oxide semiconductor material comprises at least one of Ni, La, Sr, Nd, Na, and Cu.

27. The semiconductor device according to claim 21, wherein the n-type oxide semiconductor film is amorphous.

28. The semiconductor device according to claim 21,
wherein the n-type oxide semiconductor film further contains an insulating material, and
wherein an atomic ratio of the insulating material to the n-type oxide semiconductor film is greater than or equal to 0.01 and less than or equal to 0.2.

29. The semiconductor device according to claim 28,
wherein the insulating material comprises at least one of silicon oxide and germanium oxide.

30. The semiconductor device according to claim 21, wherein the p-type oxide semiconductor material is contained in the n-type oxide semiconductor film at a time of forming the n-type oxide semiconductor film.

* * * * *